(12) United States Patent
Nakamura

(10) Patent No.: US 11,367,772 B2
(45) Date of Patent: Jun. 21, 2022

(54) DISPLAY DEVICE AND ELECTRONIC DEVICE WITH PERIPHERAL WIRING CONNECTION TO CATHODE ELECTRODE

(71) Applicant: Sony Semiconductor Solutions Corporation, Kanagawa (JP)

(72) Inventor: Kouichi Nakamura, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 67 days.

(21) Appl. No.: 16/961,382

(22) PCT Filed: Dec. 19, 2018

(86) PCT No.: PCT/JP2018/046731
§ 371 (c)(1),
(2) Date: Jul. 10, 2020

(87) PCT Pub. No.: WO2019/142582
PCT Pub. Date: Jul. 25, 2019

(65) Prior Publication Data
US 2020/0365680 A1  Nov. 19, 2020

(30) Foreign Application Priority Data
Jan. 18, 2018  (JP) .................. 2018-006072

(51) Int. Cl.
*H01L 29/08* (2006.01)
*H01L 27/32* (2006.01)
*H01L 51/50* (2006.01)
*H01L 51/52* (2006.01)

(52) U.S. Cl.
CPC ...... *H01L 27/3279* (2013.01); *H01L 51/5012* (2013.01); *H01L 51/5221* (2013.01)

(58) Field of Classification Search
CPC ............ H01L 27/3279; H01L 51/5012; H01L 51/5221
See application file for complete search history.

(56) References Cited

U.S. PATENT DOCUMENTS

| 2006/0012295 A1* | 1/2006 | Kobayashi | H01L 51/5281 313/506 |
| 2006/0027804 A1* | 2/2006 | Yamazaki | G02F 1/1368 257/59 |
| 2014/0353609 A1* | 12/2014 | Song | H01L 51/5221 257/40 |
| 2017/0207288 A1* | 7/2017 | Kang | H01L 27/3276 |

FOREIGN PATENT DOCUMENTS

JP   2014-199739 A   10/2014

* cited by examiner

*Primary Examiner* — Phuc T Dang
(74) *Attorney, Agent, or Firm* — Michael Best & Friedrich LLP

(57) ABSTRACT

A display device of the present disclosure includes an organic EL layer formed on a circuit portion, which is formed on a substrate, with an insulating film interposed therebetween, a cathode electrode formed on the organic EL layer in common to all pixels, and a metal wiring provided on an outer peripheral portion of an effective pixel region and electrically connecting the cathode electrode to a wiring of the circuit portion. Then, the metal wiring has a recess or a projection on a contact surface in a connection portion with the cathode electrode. Furthermore, an electronic device according to the present disclosure has the display device having the above configuration.

19 Claims, 38 Drawing Sheets

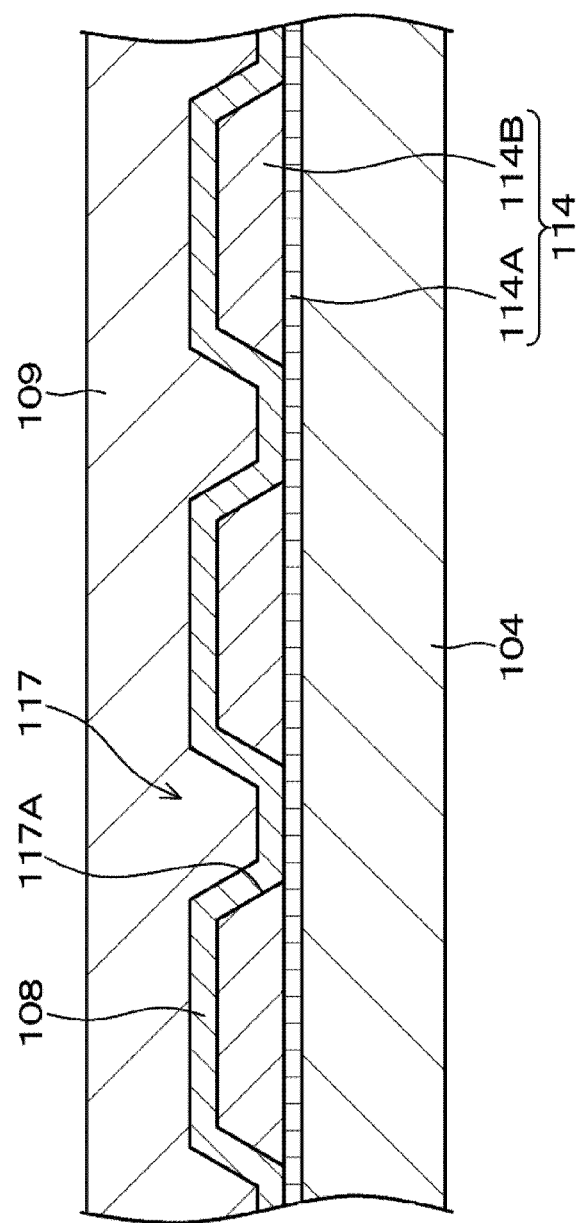

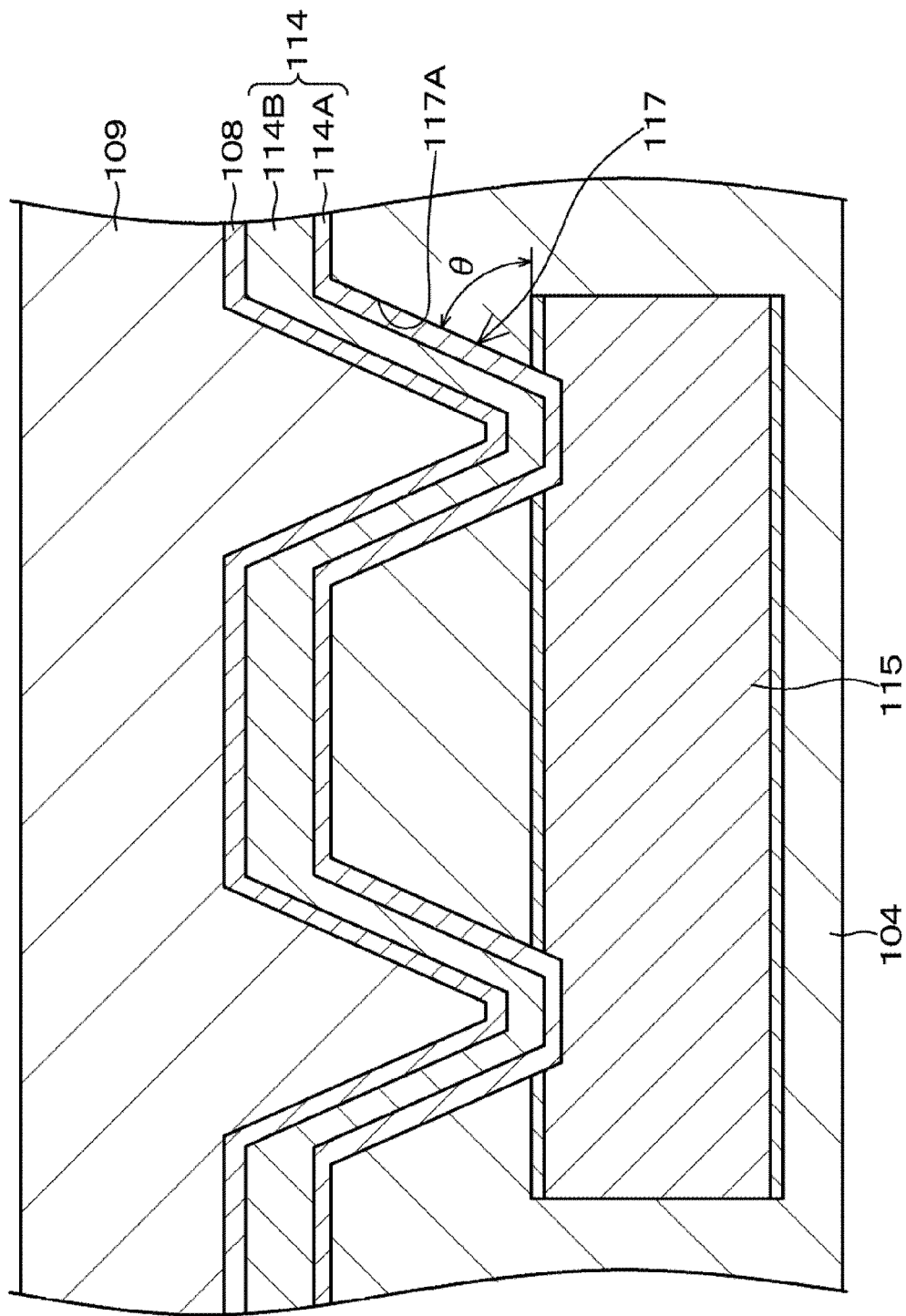

ary of a wiring structure of a metal wiring according to Example

DISPLAY DEVICE AND ELECTRONIC DEVICE WITH PERIPHERAL WIRING CONNECTION TO CATHODE ELECTRODE

TECHNICAL FIELD

The present disclosure relates to a display device and an electronic device.

BACKGROUND ART

The mainstream of display devices in these years is a display device of flat type (flat panel type). As one of flat-type display devices, there is a display device using what is called current-driven electro-optical element whose light emission luminance changes according to the value of a current flowing through the device as a light-emitting portion (light-emitting element) of a pixel. As a current-driven electro-optical element, an organic EL element is known that uses electroluminescence (EL) of an organic material and uses a phenomenon of emitting light when an electric field is applied to an organic thin film.

An organic EL display device using organic EL elements as light emitting units of pixels generally has a configuration in which an insulating film is provided in a state of covering a circuit portion formed on a substrate using a thin film transistor (TFT), and the organic EL elements are arranged and formed on the insulating film. Furthermore, on the organic EL elements, a cathode electrode is formed as an upper electrode in common to all pixels. The cathode electrode needs to be electrically connected to the circuit portion.

In order to electrically connect the cathode electrode to the circuit portion, conventionally, a configuration is employed in which a contact region is provided on an outer peripheral portion of an effective pixel region (display region), and the cathode electrode and the circuit portion are electrically connected in the contact region (for example, see Patent Document 1).

CITATION LIST

Patent Document

Patent Document 1: Japanese Patent Application Laid-Open No. 2014-199739

SUMMARY OF THE INVENTION

Problems to be Solved by the Invention

Incidentally, the contact region provided on the outer peripheral portion of the effective pixel region for the purpose of electrical connection between the cathode electrode and the circuit portion is a rate limiting factor for the width of a frame (panel peripheral edge portion) of the display panel. A large frame width of the display panel leads to an increase in manufacturing cost due to a decrease in theoretical yield, and also limits the design of a product equipped with the display device, which reduces the commercial value as a device. In particular, in a case of a small display device using a semiconductor substrate, the ratio of an effective screen to a chip size is small, and thus the influence of the size of an outer peripheral portion of the screen that is the frame of the display panel is significant.

Therefore, it is an object of the present disclosure to provide an organic EL display device in which a frame of a display panel can be narrowed upon providing a contact region that electrically connects a cathode electrode and a circuit portion on an outer peripheral portion of an effective pixel region, and an electronic device having the organic EL element.

Solutions to Problems

A display device of the present disclosure for achieving the above object has:

an organic electroluminescence (EL) layer formed on a circuit portion, which is formed on a substrate, with an insulating film interposed therebetween;

a cathode electrode formed on the organic EL layer in common to all pixels; and a metal wiring provided on an outer peripheral portion of an effective pixel region and electrically connecting the cathode electrode to a wiring of the circuit portion, in which the metal wiring has a recess or a projection on a contact surface in a connection portion with the cathode electrode.

Furthermore, an electronic device of the present disclosure for achieving the above object has a display device having the configuration described above.

BRIEF DESCRIPTION OF DRAWINGS

FIG. 10 is a cross-sectional view illustrating a summary of a wiring structure of a metal wiring according to Example 3.

FIG. 14 is a cross-sectional view illustrating a summary of a wiring structure of a metal wiring according to Example 5.

MODE FOR CARRYING OUT THE INVENTION

Figure 1:
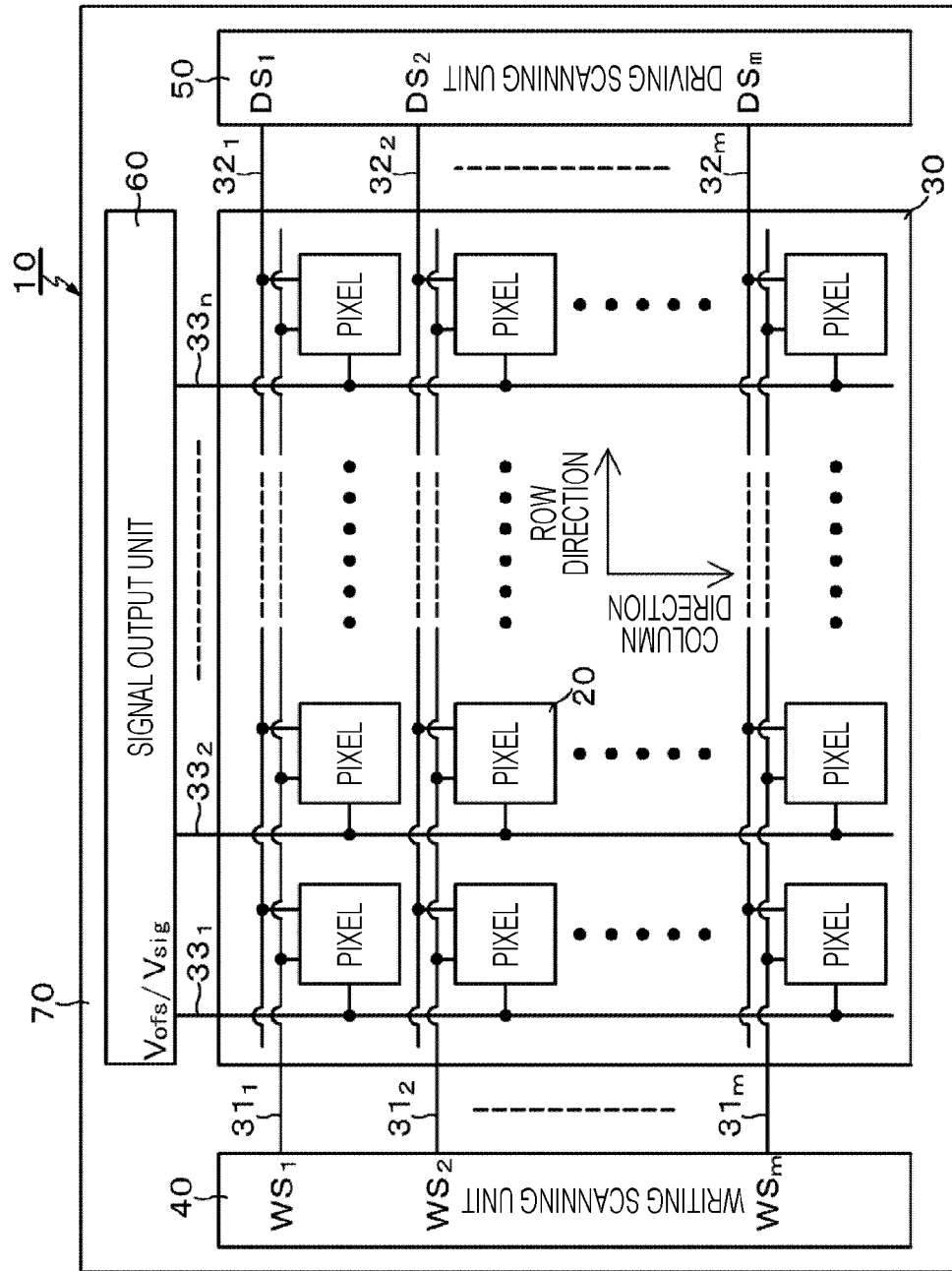
FIG. 1 is a system configuration diagram illustrating a configuration outline of an active matrix organic EL display device of the present disclosure.

Hereinafter, modes for carrying out the technology of the present disclosure (hereinafter, described as "embodiment") will be described in detail using the drawings. The technology of the present disclosure is not limited to the embodiment, and various numerical values, materials, and the like in the embodiment are examples. In the following description, the same elements or elements having the same functions will be denoted by the same reference symbols, and duplicated descriptions will be omitted. Note that the description will be made in the following order.

1. General description about display device and electronic device of present disclosure
2. Display device of present disclosure
   2.1. System configuration
   2-2. Pixel circuit
   2-3. Cross-sectional structure of display panel
   2-4. Contact structure of cathode electrode
3. Embodiment
   3-1. Example 1 (example of contact structure of cathode electrode according to present disclosure)
   3-2. Example 2 (example of wiring structure of metal wiring: example of processing first and second metal layers simultaneously)
   3-3. Example 3 (modification example of Example 2: example of processing only second metal layer)
   3-4. Example 4 (modification example of Example 2: example in which wiring structure has one-layer structure)
   3-5. Example 5 (example in which wiring structure of metal wiring also serves as contact with lower wiring)
   3-6. Example 6 (modification example of Example 5: example in which wiring structure of metal wiring has three-layer structure)
   3-7. Example 7 (modification example of Example 5: example in which contact area of two-layer wiring structure is enlarged)
   3-8. Example 8 (modification example of Example 6: example in which contact area of three-layer wiring structure is enlarged)
   3-9. Example 9 (example of combination of Example 3 and Example 6)
   3-10. Example 10 (example of having intermediate electrode for connecting to cathode electrode)
   3-11. Example 11 (modification example of Example 10: example in which intermediate electrode has uneven structure)
   3-12. Example 12 (modification example of Example 10: example of having no intermediate electrode)
   3-13. Example 13 (example of layout pattern of recesses of metal wiring)
      3-13-1. Pattern example 1 (example of layout in lattice shape)
      3-13-2. Pattern example 2 (example of layout in rosary connection shape)

3-13-3. Pattern example 3 (example of layout in jagged connection shape)
4. Modification example
5. Electronic devices of present disclosure
5-1. Specific Example 1 (example of digital still camera)
5-2. Specific Example 2 (example of head-mounted display)
6. Configurations that present disclosure can employ <General Description about Display Device and Electronic Device of the Present Disclosure>

In a display device and an electronic device according to the present disclosure, a configuration can be employed in which a plurality of recesses or projections is provided on a contact surface with a cathode electrode. Furthermore, a configuration can be employed in which the recesses are laid out in a lattice shape, a rosary connection shape, or a jagged connection shape.

In the display device and the electronic device of the present disclosure including the above-described preferred configuration, a configuration can be employed in which the recess or the projection has a tapered surface with a taper angle equal to or smaller than an angle that allows maintaining a film thickness of the cathode electrode equal to or larger than a certain value with respect to a base surface. At this time, the taper angle is preferably 60 degrees or less.

Furthermore, in the display device and the electronic device of the present disclosure including the above-described preferred configuration, a configuration can be employed in which a metal wiring includes a first metal layer and a second metal layer stacked in this order, and a recess is formed so as to have a depth reaching a base by removing the first metal layer and the second metal layer.

Furthermore, in the display device and the electronic device of the present disclosure including the above-described preferred configuration, a configuration can be employed in which a metal wiring includes a first metal layer and a second metal layer stacked in this order, and a recess is formed by removing the second metal layer so that a bottom surface is in contact with the first metal layer. At this time, it is preferable that the first metal layer has a smaller contact resistance than the second metal layer.

Furthermore, in the display device and the electronic device of the present disclosure including the above-described preferred configuration, a configuration can be employed in which the recess is formed so as to reach a lower wiring by processing an interlayer insulating layer of the base. Then, a configuration can be employed in which the metal wiring includes a first metal layer and a second metal layer stacked in this order, and a wiring structure of the recess is a three-layer structure having a third metal layer between the first metal layer and the second metal layer.

Furthermore, in the display device and the electronic device of the present disclosure including the above-described preferred configuration, a configuration can be employed in which the recess is formed so as to reach an inside of the lower wiring by processing an interlayer insulating layer of the base and the lower wiring. Then, a configuration can be employed in which the metal wiring includes a first metal layer and a second metal layer stacked in this order, and a wiring structure of the recess is a three-layer structure having a third metal layer between the first metal layer and the second metal layer.

Furthermore, in the display device and the electronic device of the present disclosure including the above-described preferred configuration, a configuration can be employed in which the recess is formed so as to reach an inside of the lower wiring by processing an interlayer insulating layer of the base and the lower wiring. Then, a configuration can be employed in which the metal wiring includes a first metal layer and a second metal layer stacked in this order, and a wiring structure of the recess is a three-layer structure having a third metal layer between the first metal layer and the second metal layer, and a second recess is formed in the projection of the metal wiring by removing the second metal layer so that a bottom surface is in contact with the first metal layer.

Furthermore, in the display device and the electronic device of the present disclosure including the above-described preferred configuration, the substrate on which the circuit portion is formed can include a semiconductor substrate.

<Display Device of the Present Disclosure>

The display device of the present disclosure is an active matrix display device in which a current flowing through an electro-optical element is controlled by an active element, an insulated-gate field-effect transistor for example, provided in the same pixel circuit as the electro-optical element. Typically, a metal oxide semiconductor (MOS) transistor and a thin film transistor (TFT) can be exemplified as the insulated-gate field-effect transistor.

Here, as an example, an active matrix organic EL display device will be described that uses, for example, an organic EL element, which is a current-driven electro-optical element whose emission luminance changes according to the value of a current flowing through the device, as a light-emitting portion (light-emitting device) of a pixel circuit. Hereinafter, the "pixel circuit" may be simply described as a "pixel".

[System Configuration]

FIG. 1 is a system configuration diagram illustrating a configuration outline of an active matrix organic EL display device of the present disclosure. As illustrated in FIG. 1, the organic EL display device 10 of the present disclosure includes a pixel array unit 30 in which a plurality of pixels 20 including organic EL elements is two-dimensionally arranged in a matrix, and a peripheral circuit (peripheral drive unit) arranged around the pixel array unit 30.

The peripheral circuit includes, for example, a writing scanning unit 40, a driving scanning unit 50, and a signal output unit 60 mounted on a same display panel 70 as the pixel array unit 30, and the like and drives each pixel 20 of the pixel array unit 30. Note that it is also possible to employ a configuration in which some or all of the writing scanning unit 40, the driving scanning unit 50, and the signal output unit 60 are provided outside the display panel 70.

As the substrate of the display panel 70, an insulating transparent substrate such as a glass substrate or a semiconductor substrate such as a silicon substrate can be used. An organic EL display device using a semiconductor substrate such as a silicon substrate as the substrate of the display panel 70 is referred to as what is called a micro display (small display), and is preferable for use as an electronic viewfinder of a digital still camera, a display unit of a head-mounted display, and the like.

The organic EL display device 10 can be configured to support monochrome (black and white) display, or can be configured to support color display. In a case where the organic EL display device 10 supports color display, one pixel (unit pixel or pixel) that is a unit for forming a color image includes a plurality of sub-pixels. At this time, each of the sub-pixels corresponds to the pixels 20 in FIG. 1. More specifically, in a display device supporting color display, one pixel includes, for example, three sub-pixels that emit light which are a sub-pixel that emits red (R) light, a sub-pixel that emits green (G) light, and a sub-pixel that emits blue (B) light.

However, one pixel is not limited to a combination of three primary color sub-pixels of RGB, and it is possible to form one pixel by further adding one or more sub-pixels of one or more colors to the three primary color sub-pixels. More specifically, for example, it is possible to form one pixel by adding a sub-pixel that emits white (W) light in order to improve luminance, or form one pixel by adding at least one sub pixel that emits complementary color light in order to expand a color reproduction range.

In the pixel array unit 30, scanning lines 31 ($31_1$ to $31_m$) and driving lines 32 ($32_1$ to $32_m$) are wired for every pixel row along a row direction (pixel arrangement direction of a pixel row, or horizontal direction) in an array of the pixels 20 in m rows and n columns. Moreover, signal lines 33 ($33_1$ to $33_n$) are wired for every pixel column along a column direction (pixel arrangement direction of a pixel column, or vertical direction) in the array of the pixels 20 in m rows and n columns.

The scanning lines $31_1$ to $31_m$ are respectively connected to output ends of corresponding rows of the writing scanning unit 40. The driving lines $32_1$ to $32_m$ are respectively connected to output ends of corresponding rows of the driving scanning unit 50. The signal lines $33_1$ to $33_n$ are respectively connected to output ends of corresponding columns of the signal output unit 60.

The writing scanning unit 40 includes a shift register circuit and the like. This writing scanning unit 40 sequentially supplies writing scanning signals WS ($WS_1$ to $WS_m$) to the scanning lines 31 ($31_1$ to $31_m$) when writing the signal voltage of a video signal to the respective pixels 20 of the pixel array unit 30, to thereby perform what is called line-sequential scanning in which the respective pixels 20 of the pixel array unit 30 are sequentially scanned by row unit.

The driving scanning unit 50 includes a shift register circuit and the like, similarly to the writing scanning unit 40. The driving scanning unit 50 supplies light emission control signals DS ($DS_1$ to $DS_m$) to the driving lines 32 ($32_1$ to $32_m$) in synchronization with line-sequential scanning by the writing scanning unit 40, to thereby control light emission or non-light emission (quenching) of the pixels 20.

The signal output unit 60 selectively outputs a signal voltage $V_{sig}$ of a video signal (hereinafter, may be simply described as a "signal voltage") according to luminance information supplied from a signal supply source (not illustrated) and a reference voltage $V_{ofs}$. Here, the reference voltage $V_{ofs}$ is a voltage corresponding to a voltage to be a reference for the signal voltage $V_{sig}$ of the video signal (for example, a voltage corresponding to a black level of the video signal), or a voltage in the vicinity thereof. The reference voltage $V_{ofs}$ is used as an initialization voltage when performing a correction operation.

The signal voltage $V_{sig}$ or the reference voltage $V_{ofs}$ alternatively output from the signal output unit 60 is written to each pixel 20 of the pixel array unit 30 via the signal line 33 ($33_1$ to $33_n$) by unit of pixel rows selected by line-sequential scanning by the writing scanning unit 40. In other words, the signal output unit 60 employs a line-sequential writing drive mode in which the signal voltage $V_{sig}$ is written by pixel row (line) unit.

[Pixel Circuit]

Figure 2:
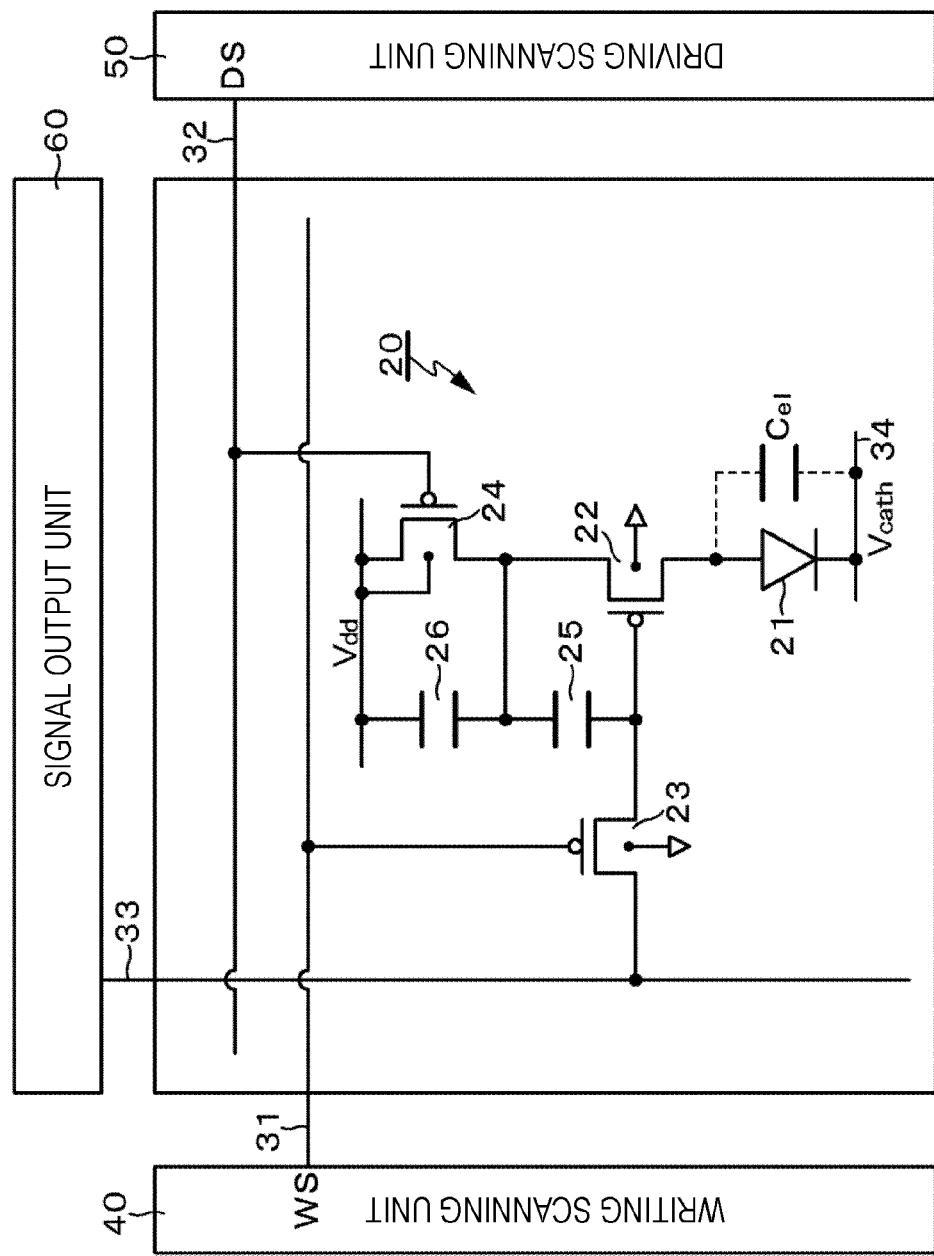
FIG. 2 is a circuit diagram illustrating an example of a circuit configuration of a pixel (pixel circuit) in the active matrix organic EL display device of the present disclosure.

FIG. 2 is a circuit diagram illustrating an example of a circuit configuration of a pixel (pixel circuit) in the active matrix organic EL display device 10 of the present disclosure. The light-emitting portion of the pixel 20 includes an organic EL element 21. The organic EL element 21 is an example of a current-driven electro-optical element whose emission luminance changes according to the value of a current flowing through the device.

As illustrated in FIG. 2, the pixel 20 includes an organic EL element 21 and a drive circuit (pixel drive circuit) that drives the organic EL element 21 by passing a current through the organic EL element 21. In the organic EL element 21, a cathode electrode is connected to a common power supply line 34 commonly wired to all the pixels 20. In the diagram, $C_{el}$ is equivalent capacitance of the organic EL element 21.

The drive circuit that drives the organic EL element 21 has a configuration including a drive transistor 22, a sampling transistor 23, a light emission control transistor 24, a holding capacitor 25, and an auxiliary capacitor 26. Here, assuming that the organic EL element 21 and its drive circuit are formed not on an insulator such as glass but on a semiconductor substrate such as a silicon substrate, a configuration using a P-channel transistor as the drive transistor 22 is employed.

Furthermore, in the present example, a configuration using P-channel transistors also as the sampling transistor 23 and the light emission control transistor 24 is employed, similarly to the drive transistor 22. Therefore, the drive transistor 22, the sampling transistor 23, and the light emission control transistor 24 have four terminals of source, gate, drain, and back gate instead of three terminals of source, gate, and drain. Power supply voltage $V_{dd}$ is applied to the back gate.

However, the sampling transistor 23 and the light emission control transistor 24 are switching transistors that function as switching elements, and thus are not limited to P-channel transistors. Accordingly, the sampling transistor 23 and the light emission control transistor 24 may be N-channel transistors or may be of a configuration in which a P-channel transistor and an N-channel transistor are mixed.

In the pixel 20 having the above configuration, the sampling transistor 23 performs writing to the holding capacitor 25 by sampling the signal voltage $V_{sig}$ of the video signal supplied from the signal output unit 60 through the signal line 33. The light emission control transistor 24 is connected between a node of the power supply voltage $V_{dd}$ and the source electrode of the drive transistor 22, and controls light emission or non-light emission of the organic EL element 21 under driving by the light emission control signal DS.

The holding capacitor 25 is connected between the gate electrode and the source electrode of the drive transistor 22. The holding capacitor 25 holds the signal voltage $V_{sig}$ of the video signal written by sampling by the sampling transistor 23. The drive transistor 22 drives the organic EL element 21 by applying a drive current according to the voltage held by the holding capacitor 25 to the organic EL element 21.

The auxiliary capacitor 26 is connected between the source electrode of the drive transistor 22 and a node of a fixed potential, for example, a node of the power supply voltage $V_{dd}$. This auxiliary capacitor 26 suppresses a source potential of the drive transistor 22 from fluctuating when the signal voltage $V_{sig}$ of the video signal is written, and also sets a gate-source voltage $V_{gs}$ of the drive transistor 22 to a threshold voltage $V_{th}$ of the drive transistor 22.

[Cross-Sectional Structure of Display Panel]

Figure 3:
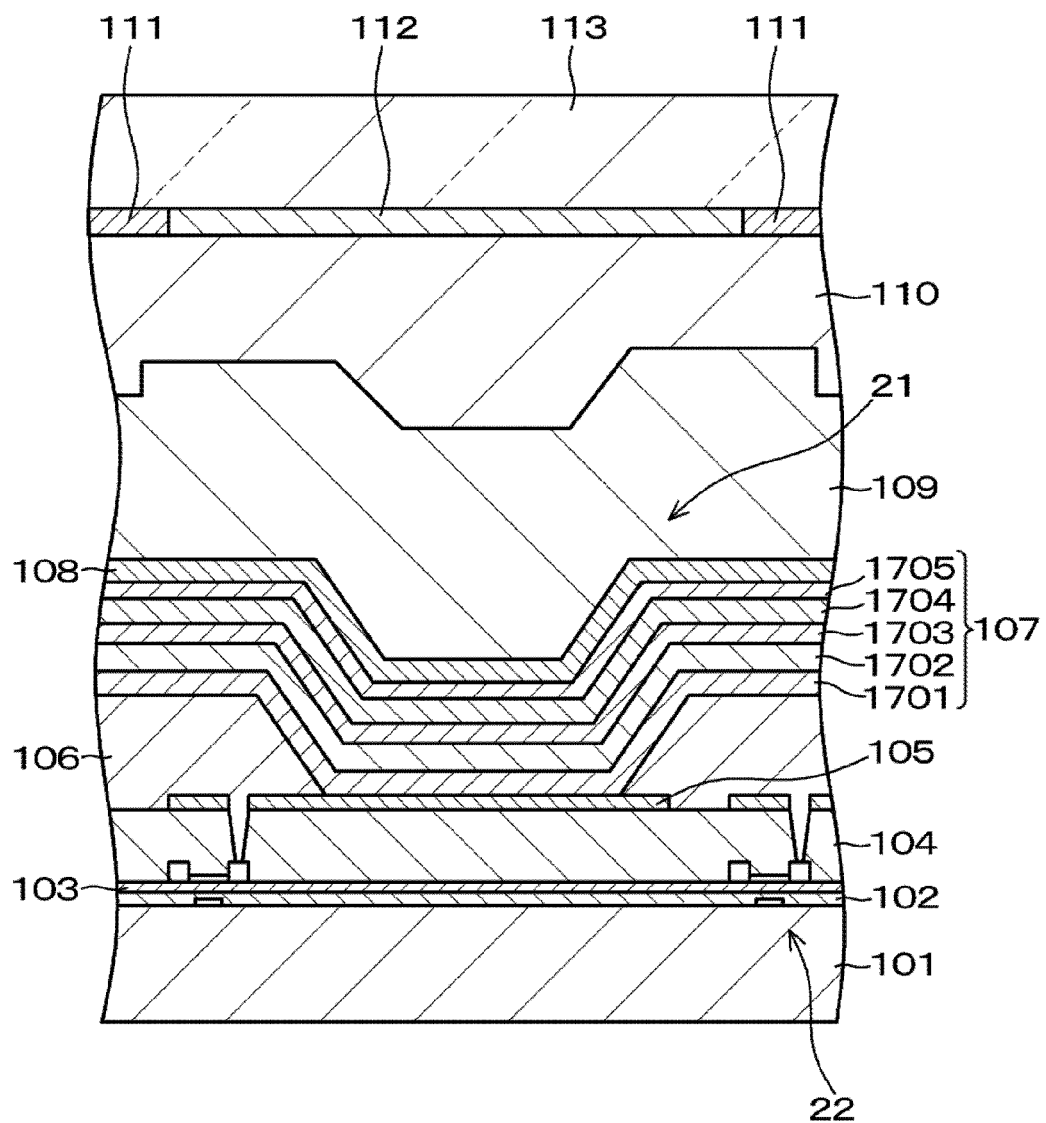
FIG. 3 is a cross-sectional view illustrating an example of a cross-sectional structure of a display panel.

FIG. 3 illustrates an example of a cross-sectional structure of the display panel 70. The display panel 70 exemplified here is a display panel of, for example, what is called a top emission type that emits color light of any one of red (R), green (G), and blue (B) from the (surface opposite to a substrate 101) side by a combination of a white organic EL element that emits white light and a color filter.

A region on the substrate 101 that constitutes the display panel 70 includes an effective pixel region (display region) in which a plurality of pixels 20 is arranged in a matrix and a peripheral region located on a periphery (outer edge side or outer peripheral side) of the effective pixel region. In the effective pixel region, a pixel drive circuit including the drive transistor 22, the sampling transistor 23, the light emission control transistor 24, the holding capacitor 25, and the auxiliary capacitor 26 is provided. In the peripheral region, a peripheral circuit including the writing scanning unit 40, the driving scanning unit 50, the signal output unit 60, and the like is provided. Then, a circuit layer 102 including these circuits is formed on the substrate 101.

The display panel 70 has, for example, a stacked structure in which an inorganic insulating layer 103, an interlayer insulating layer 104, an anode electrode 105, an organic insulating layer 106, an organic EL layer 107, a cathode electrode 108, an organic protective layer 109, a filler layer (adhesive layer) 110, and a black matrix layer 111 are stacked in this order on the circuit layer 102. Note that a color filter 112 is provided in the same layer as the black matrix layer 111 by pixel unit. Furthermore, a sealing substrate 113 is adhered to the stacked structure, so as to seal the stacked structure by the sealing substrate 113.

In the stacked structure described above, the anode electrode 105, the organic EL layer 107, and the cathode electrode 108 have a stacked structure constituting the above-described white organic EL element. The anode electrode 105 is provided for every pixel 20 of each color in the effective pixel region. The cathode electrode 108 includes a transparent electrode, and is provided as an electrode common to each of the pixels 20 in the effective pixel region. The cathode electrode 108 is formed on the substrate 101 so as to extend from the effective pixel region to an outside region.

The organic EL layer 107 has a stacked structure in which a hole injection layer 1071, a hole transport layer 1072, a light emitting layer 1073, an electron transport layer 1074, and an electron injection layer 1075 are stacked in this order from the anode electrode 105 side. Among these layers, layers other than the light emitting layer 1073 are only required to be provided as needed.

The hole injection layer 1071 is provided to increase hole injection efficiency and prevent leakage. The hole transport layer 1072 is for improving efficiency of transporting holes to the light emitting layer 1073. In the light emitting layer 1073, recombination of electrons and holes occurs when an electric field is applied, and light is generated. The electron transport layer 1074 is for increasing efficiency of transporting electrons to the light emitting layer 1073. The electron injection layer 1075 is for increasing electron injection efficiency.

As described above, the organic EL display device 10 according to the present embodiment has a configuration in which the interlayer insulating layer 104 is provided in a state of covering the circuit portion (pixel drive circuit and peripheral circuit) formed on the substrate 101, and an organic EL element 21 is formed on this interlayer insulating layer 104. Then, the anode electrode 105 is provided under the organic EL element 21 as a lower electrode by pixel unit, whereas the cathode electrode 108 is provided on the organic EL element 21 as an upper electrode in common to all pixels.

[Contact Structure of Cathode Electrode]

The cathode electrode 108 needs to be electrically connected to the wiring of the circuit portion formed on the substrate 101. In order to achieve this electrical connection, in the organic EL display device 10, a contact region is provided on the outer peripheral portion of the effective pixel region (display region), and electrical connection between the cathode electrode 108 and the wiring of the circuit portion is established in this contact region.

In FIG. 3, illustration of the structure of the contact region is omitted. The contact region of the cathode electrode 108 is a rate limiting factor in the width of the frame (panel peripheral edge portion) of the display panel 70. Therefore, the frame width needs to satisfy the following conditions 1 and 2 in consideration of manufacturing variations of an end face of a film formation area of the organic EL layer 107 and an end face of a film formation area of the cathode electrode 108.

Condition 1: the organic EL layer 107 always covers the effective pixel region, and the end surface of the film formation area of the organic EL layer 107 exists on the contact region. This is for preventing the cathode electrode 108 from experiencing what is called disconnection by step and becoming electrically open due to the influence of a step of the circuit layer 102.

Condition 2: the contact region satisfies a desired width (area) in order to reduce contact resistance between a metal wiring having a function as a cathode connecting electrode and the cathode electrode 108.

Figure 4A:
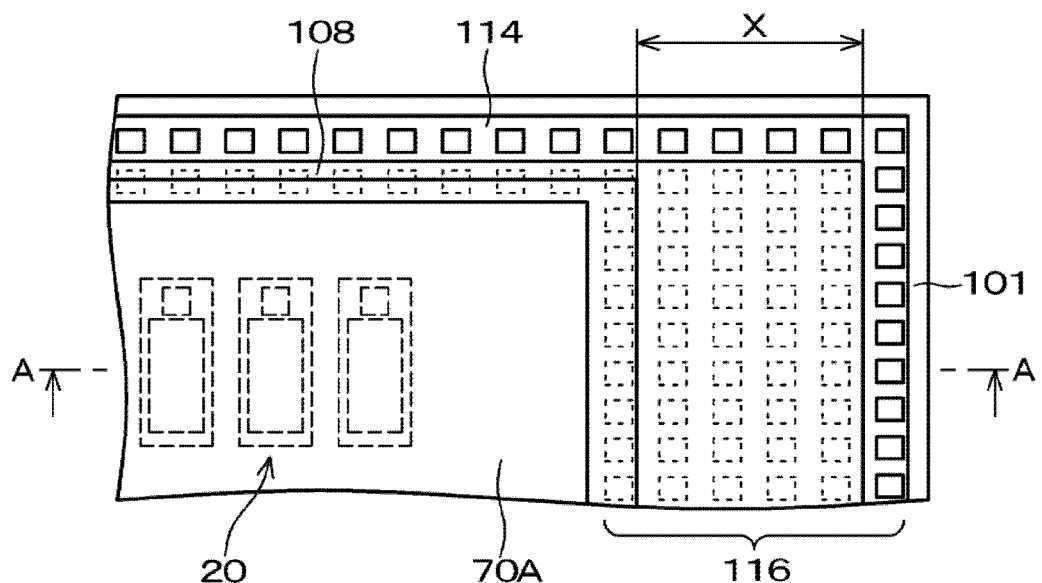
FIG. 4A is a plan view illustrating a part of a contact structure of a cathode electrode according to a conventional example.
Figure 4B:
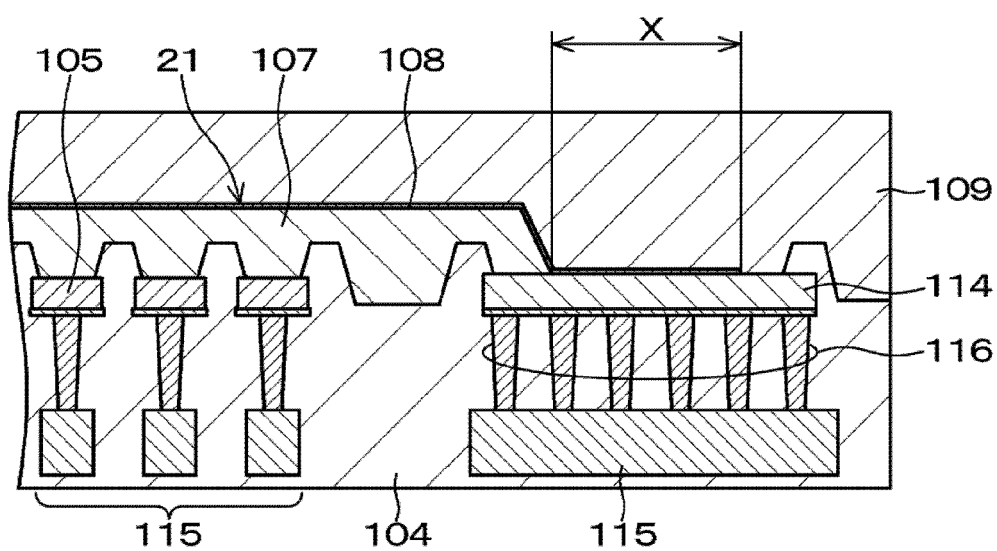
FIG. 4B is a cross-sectional view taken along a line A-A in FIG. 4A.

Here, a conventional example of a contact structure of a cathode electrode will be described. FIG. 4A illustrates a plan view of a part of a contact structure of a cathode electrode according to a conventional example, and FIG. 4B illustrates a cross-sectional view taken along a line A-A in FIG. 4A.

In order to make the frame width satisfying the above conditions 1 and 2, in the contact structure of the cathode electrode according to the conventional example, the cathode electrode 108 is formed so as to have an end portion with a tapered shape, in order to prevent disconnection by step due to a base step, by a size larger than the film formation area of the organic EL layer 107. Then, in a contact region X outside the end surface of the film formation area of the organic EL layer 107, the cathode electrode 108 is electrically connected to a metal wiring 114 that is a cathode connecting electrode. The metal wiring 114 is electrically connected to a wiring (hereinafter also described as "lower wiring") 115 of the circuit portion connected to a power supply via a contact portion 116 using a metal material for contact such as tungsten.

In the contact structure of the cathode electrode configured as described above, a contact surface of the metal wiring 114 with the cathode electrode 108 is a flat surface. Then, to reduce contact resistance in a connection portion between the cathode electrode 108 and the metal wiring 114, it is necessary to lay out the metal wiring 114 with a wide wiring. However, laying out the metal wiring 114 with a wide wiring means to secure a large region as the contact region X which is a rate limiting factor of the frame width of the display panel 70.

Then, a large frame width of the outer peripheral portion of an effective pixel region 70A of the display panel 70 leads to an increase in manufacturing cost due to a decrease in theoretical yield, and also limits the design of a product equipped with the display device, which reduces commerciality as a device. In particular, in the case of a small-sized display device using a semiconductor substrate, the ratio of the effective screen to the chip size is small, and thus influence of size of the outer peripheral portion of the screen becomes significant.

Embodiment

Accordingly, in the present embodiment, the metal wiring 114 provided on the outer peripheral portion of the effective pixel region 70A and electrically connecting the cathode electrode 108 to the circuit portion (more specifically, the lower wiring 115) has a structure having recesses or projections on a contact surface in the connection portion with the cathode electrode 108. Thus, even if the size of the contact region X is the same, the contact area between the metal wiring 114 and the cathode electrode can be increased by a component of a cross section (tapered surface) of the recess or the projection.

Then, since the contact area between the metal wiring 114 and the cathode electrode 108 can be increased, the contact resistance between the metal wiring 114 and the cathode electrode 108 can be reduced. In other words, in a case where the contact resistance between the metal wiring 114 and the cathode electrode 108 is set to the same contact resistance as in a case where the contact surface is flat (that is, in the case of the conventional example), the size of the contact region X can be reduced by the amount by which the contact resistance can be reduced by providing a recess or a projection on the contact surface. Thus, a frame of the display panel 70 can be narrowed by the amount by which the size of the contact region X can be reduced.

Hereinafter, a specific example of the contact structure of the cathode electrode 108 for reducing the area of the contact region X and narrowing the frame of the display panel 70 will be described.

In each of the following examples, a case where recesses are formed on the contact surface in the connection portion of the metal wiring 114 with the cathode electrode 108 will be described as an example, but it is not limited to the example of forming the recesses. In other words, since the tapered surface of a recess having a tapered shape is utilized from the viewpoint of increasing the contact area between the metal wiring 114 and the cathode electrode, similar operation and effect can be obtained also by employing a projection instead of the recess and utilizing a tapered surface of this projection.

Example 1

Figure 5:
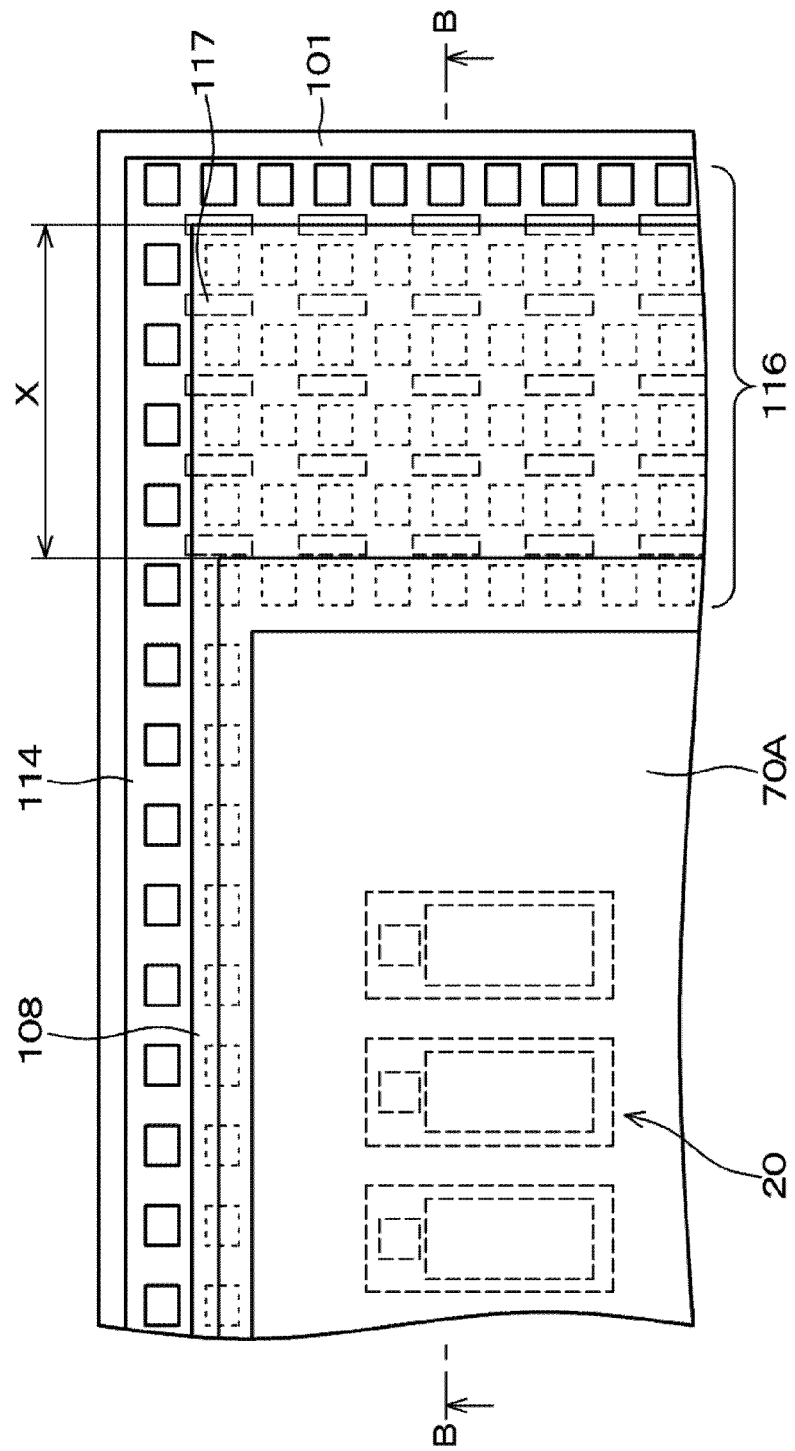
FIG. 5 is a plan view illustrating a part of the contact structure of the cathode electrode according to Example 1.
Figure 6:
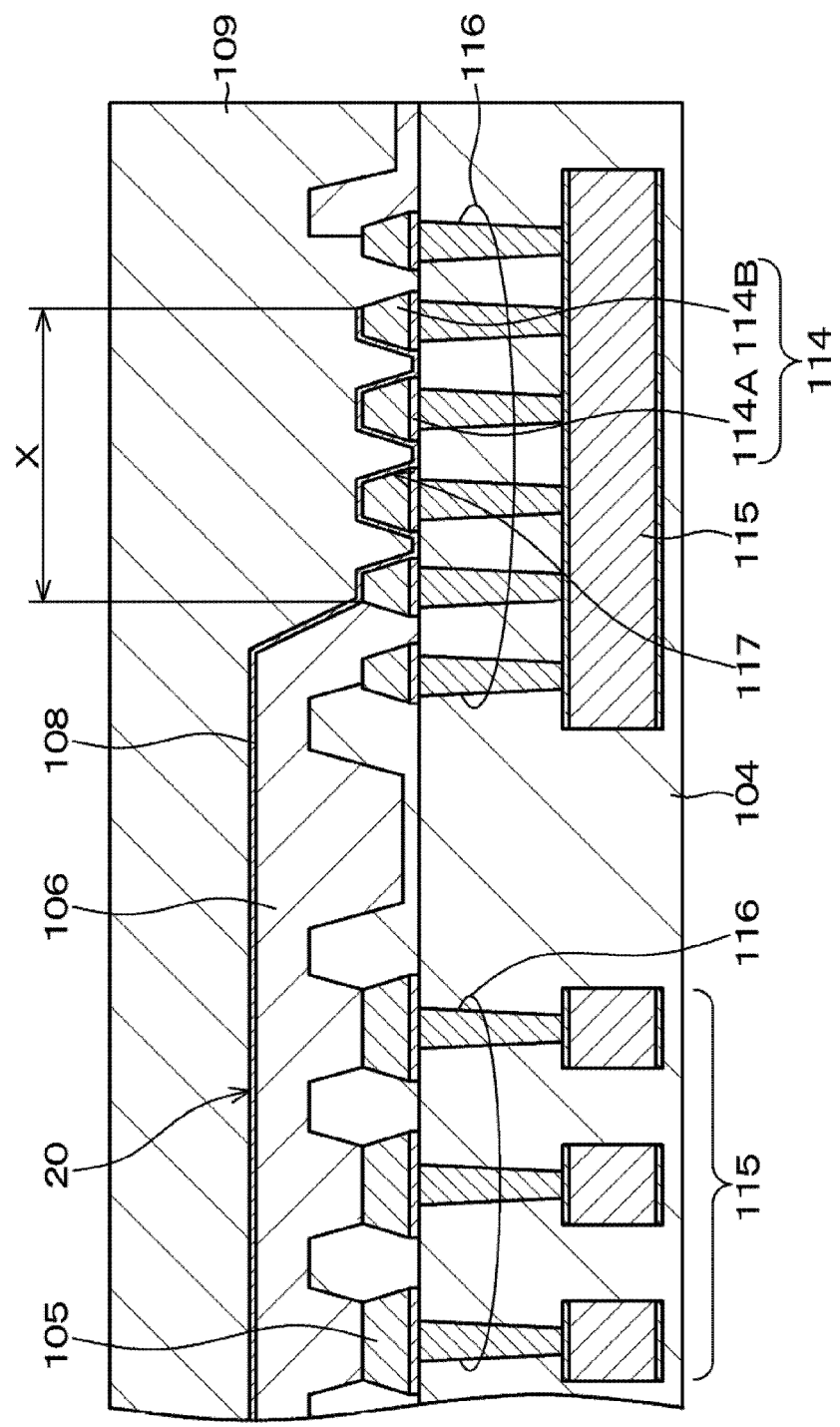
FIG. 6 is a cross-sectional view taken along a line B-B in FIG. 5.

Example 1 is an example of a contact structure of a cathode electrode 108 for reducing the area of the contact region X and narrowing the frame of the display panel 70. FIG. 5 is a plan view of a part of the contact structure of the cathode electrode 108 according to Example 1, and FIG. 6 is a cross-sectional view taken along a line B-B in FIG. 5.

In the contact structure of the cathode electrode 108 according to Example 1, a metal wiring 114 that electrically connects the cathode electrode 108 to a lower wiring 115 of the circuit portion has, for example, a two-layer structure in which a first metal layer 114A and a second metal layer 114B are stacked. In this two-layer structure, the first metal layer 114A is a lower metal layer, and the second metal layer 114B is an upper metal layer. The first metal layer 114A as a lower layer preferably has a lower contact resistance than the second metal layer 114B as an upper layer.

As a material for the first metal layer 114A, titanium (Ti) can be exemplified, and as the second metal layer 114B, an aluminum-copper alloy (AlCu) can be exemplified. However, the combination of respective materials for the first metal layer 114A and the second metal layer 114B is not limited to the combination of titanium and an aluminum-copper alloy.

The following combinations can be exemplified as other material combinations of the first metal layer 114A and the second metal layer 114B. Materials for the first metal layer 114A can include titanium nitride (TiN), tantalum (Ta), tantalum nitride (TaN), and tungsten (W). Furthermore, materials for the second metal layer 114B can include titanium (Ti) and indium tin oxide (ITO: an inorganic mixture of indium oxide and tin oxide). The respective materials for the first metal layer 114A and the second metal layer 114B are similar in each example as described later.

The contact structure of the cathode electrode 108 according to Example 1 has a configuration in which a plurality of recesses 117 is preferably provided on the contact surface of the metal wiring 114 with the cathode electrode 108. That is, the contact surface of the metal wiring 114 with the cathode electrode 108 has an uneven structure including the plurality of recesses 117. The recesses 117 are formed to be located between the contact portion 116 and the contact portion 116 electrically connecting the metal wiring 114 and the lower wiring 115 in the contact region X where the cathode electrode 108 and the metal wiring 114 are connected.

Figure 7A:
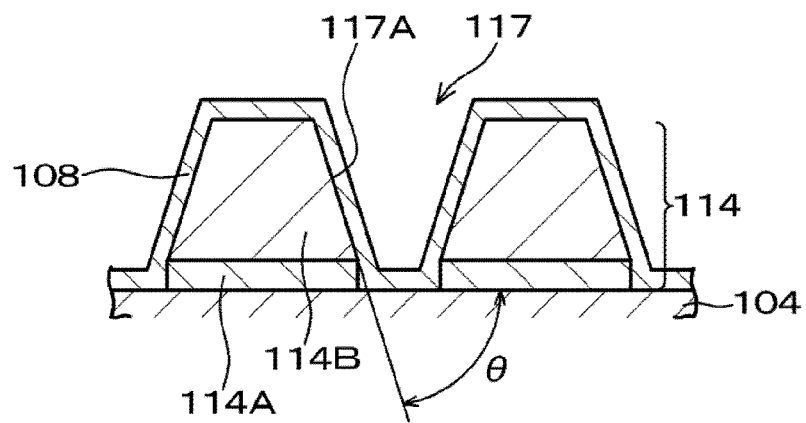
FIG. 7A is an explanatory view regarding a taper angle of a tapered surface of a recess of a metal wiring.

As illustrated in FIG. 7A, a recess 117 preferably has a cross-sectional shape (tapered recess shape) having a tapered surface 117A inclined with respect to a base surface (an interface of the interlayer insulating layer 104 as a base). The cathode electrode 108 is formed as a vapor deposition film by a vapor deposition process on the metal wiring 114 having the recesses 117 on the contact surface with the cathode electrode 108. Here, a taper angle $\theta$ of the tapered surface 117A of the recess 117 with respect to the base surface is an angle that allows maintaining the film thickness of the cathode electrode 108 equal to or larger than a certain value, for example, an angle of 60 degrees or less, preferably 55 degrees or less.

Figure 7B:
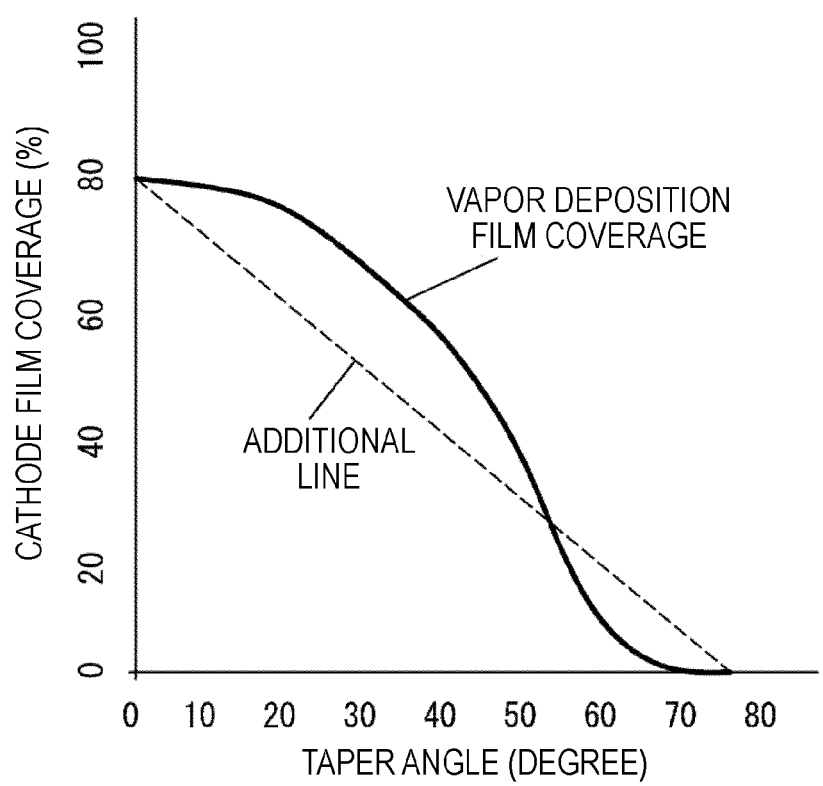
FIG. 7B is a diagram illustrating a relationship between the taper angle and a cathode film coverage.

Note that regarding the numerical values of 60 degrees and 55 degrees exemplified here, other than a case where they are strictly these numerical values, a case where they are substantially these numerical values is included, and various variations caused by design or manufacturing are tolerated. FIG. 7B illustrates a relationship between the taper angle $\theta$ of the tapered surface 117A of the recess 117 and a coverage of the cathode film (cathode electrode). From a vapor deposition film coverage curve of the cathode electrode 108 in FIG. 7B, it can be seen that the taper angle $\theta$ is preferably 55 degrees or less as an angle that allows maintaining the film thickness of the cathode electrode 108 equal to or larger than a certain value. By setting this taper angle $\theta$, the film thickness of the cathode electrode 108 equal to or larger than a certain value can be maintained, and thus resistance of the cathode electrode 108 itself can be prevented from increasing.

As described above, in the contact structure of the metal wiring 114 according to Example 1, the contact surface of the metal wiring 114 with the cathode electrode 108 has the uneven structure including the plurality of recesses 117, and thus the contact area between the metal wiring 114 and the cathode electrode can be increased by components of the tapered surfaces 117A of the recesses 117. Therefore, the contact resistance can be reduced by an amount that can increase the contact area, and thus the frame of the display panel 70 can be narrowed.

Example 2

Figure 8:
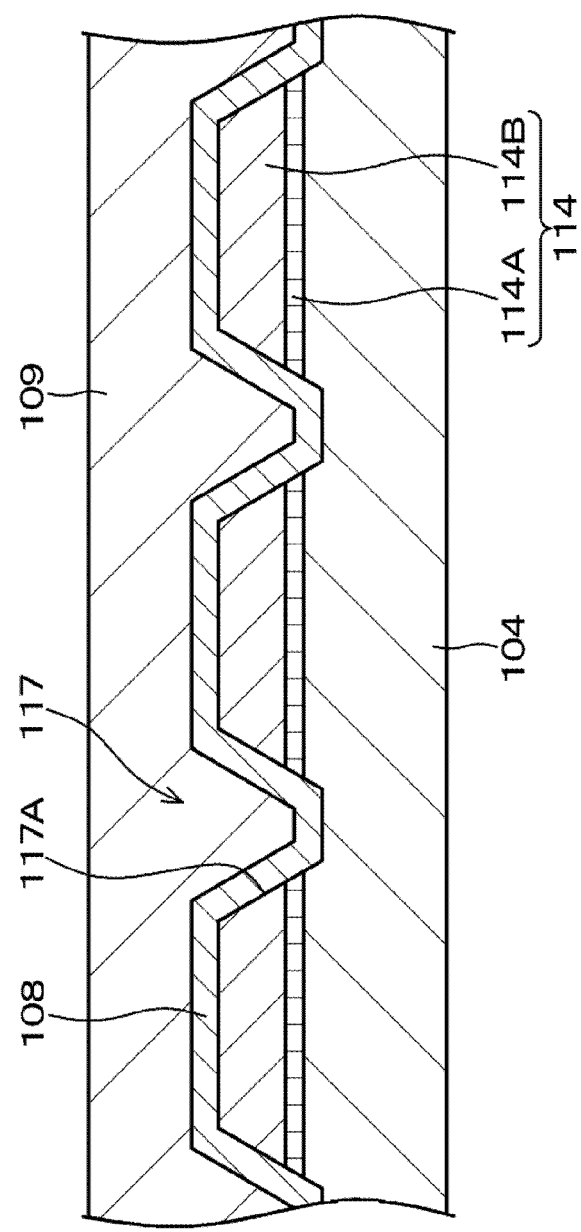
FIG. 8 is a cross-sectional view illustrating a summary of a wiring structure of a metal wiring according to Example 2.

Example 2 is an example of a wiring structure of a metal wiring 114, in which a first metal layer 114A and a second metal layer 114B are simultaneously processed to form recesses 117. FIG. 8 illustrates a cross-sectional view of the wiring structure of the metal wiring 114 according to Example 2.

The wiring structure of the metal wiring 114 according to Example 2 has a structure such that in the metal wiring 114 having a two-layer structure of a first metal layer 114A and a second metal layer 114B, a first metal layer 114A and a second metal layer 114B are simultaneously processed and removed, and recesses 117 are formed so as to have a depth reaching the interlayer insulating layer 104 as a base. Then, a cathode electrode 108 is formed on the metal wiring 114 including the recesses 117 by a vapor deposition process. This wiring structure can be processed simultaneously with the pixel array unit 30.

The taper angle θ of a tapered surface 117A of a recess 117 is, for the reason described above, processed at an angle that allows maintaining the film thickness of the cathode electrode 108 equal to or larger than a certain value (for example, 60 degrees or less, preferably 55 degrees or less). The taper angle θ of the tapered surface 117A is similar in each example as described later.

As described above, the wiring structure of the metal wiring 114 according to Example 2 is a structure in which the first metal layer 114A and the second metal layer 114B are simultaneously processed to form the recesses 117 with a depth reaching the interlayer insulating layer 104. As described above, by forming the recesses 117 with a depth reaching the interlayer insulating layer 104, areas of the tapered surfaces 117A of the recesses 117 can be secured wider. Thus, the contact area between the metal wiring 114 and the cathode electrode can be further increased, the contact resistance can be reduced by that amount, and thus the frame of the display panel 70 can be narrowed. Furthermore, since the first metal layer 114A and the second metal layer 114B are simultaneously processed to form the recesses 117, a planar metal layer region is reduced and reflectance is reduced. Thus, an antireflection effect is improved and the effect of reducing reflection can be improved.

Next, an outline of manufacturing processes of the wiring structure of the metal wiring 114 according to Example 2 will be described with reference to FIG. 9.

Figure 9A:
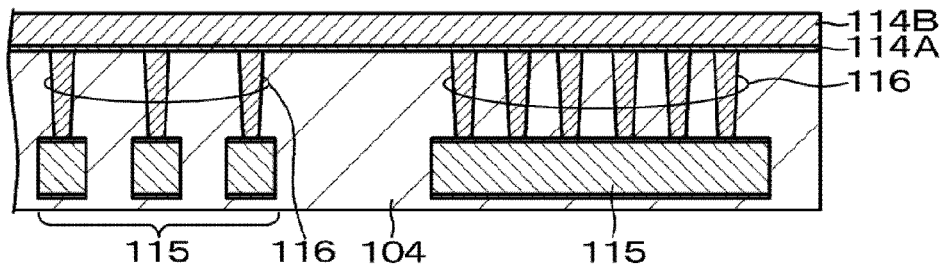
FIG. 9A to FIG. 9D are process views illustrating manufacturing steps of the wiring structure of the metal wiring according to Example 2.
Figure 9B:
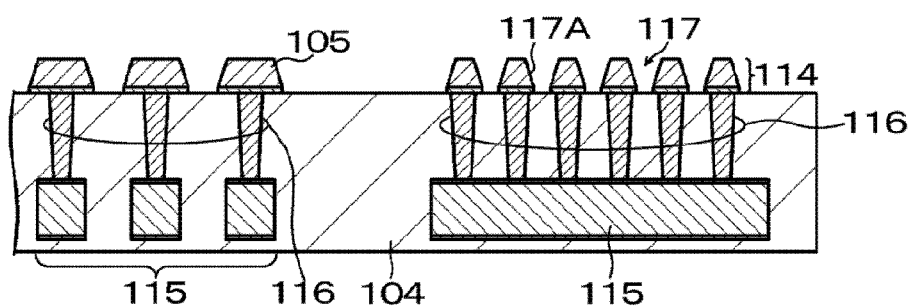
Figure 9C:
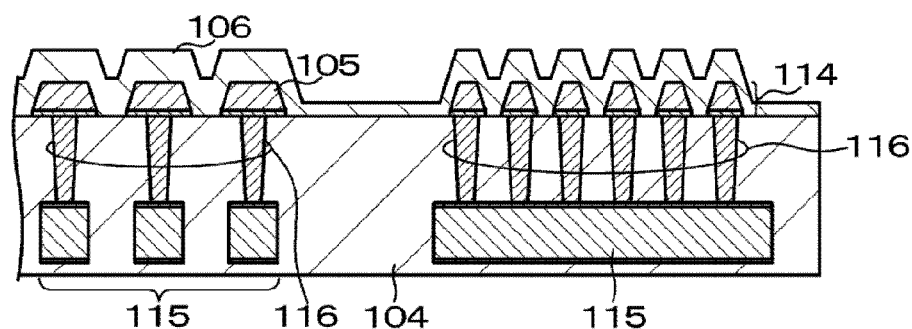
Figure 9D:
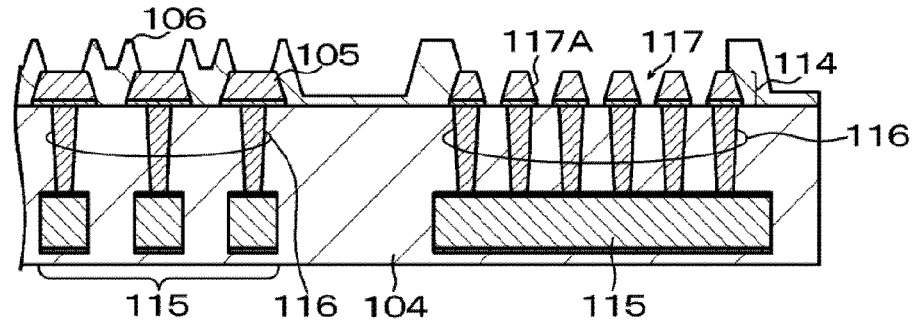

After forming a lower wiring 115 and contact portions 116, a first metal layer 114A and a second metal layer 114B for forming anode electrodes 105 and the metal wiring 114 are formed (step in FIG. 9A). Next, PR/DET is performed to pattern the anode electrodes 105 and the metal wiring 114 (step in FIG. 9B).

At this time, the anode electrodes 105 and the metal wiring 114 have a taper angle θ (for example, an angle of 60 degrees or less, preferably 55 degrees or less) that allows maintaining the film thickness of the cathode electrode 108 equal to or larger than a certain value. As a result, recesses 117 having a tapered surface 117A are formed in the metal wiring 114.

Next, an organic insulating layer 106 as an uppermost layer is formed (step in FIG. 7C), and then the organic insulating layer 106 on the anode electrodes 105 and the metal wiring 114 is opened (step in FIG. 7D). Thereafter, a cathode electrode 108 is formed on the anode electrodes 105 and the metal wiring 114 by a vapor deposition process.

Example 3

Example 3 is a modification example of Example 2, and is an example in which only the second metal layer 114B is processed to form the recesses 117. FIG. 10 illustrates a cross-sectional view of a wiring structure of a metal wiring 114 according to Example 3.

A wiring structure of the metal wiring 114 according to Example 3 is a structure in which only the second metal layer 114B is processed and removed in the metal wiring 114 having the two-layer structure of the first metal layer 114A and the second metal layer 114B to leave the first metal layer 114A, and recesses 117 having a tapered shape with a taper angle θ are formed so that bottom surfaces of the recesses 117 are in contact with the first metal layer 114A. Then, a cathode electrode 108 is formed on the metal wiring 114 including the recesses 117 by a vapor deposition process. This wiring structure is formed by providing a processing step different from that of the pixel array unit 30.

As described above, the wiring structure of the metal wiring 114 according to Example 3 has a structure in which only the second metal layer 114B is processed and the recesses 117 are formed while leaving the first metal layer 114A. Thus, the cathode electrode 108 and the metal wiring 114 are electrically connected to each other at cross sections of the second metal layer 114B and an upper surface of the first metal layer 114A, and thus the contact resistance can be reduced more than in a case where connection is made at respective cross sections of the second metal layer 114B and the first metal layer 114A similarly to Example 2. In particular, in a case where the material for the first metal layer 114A is titanium, for the connection between the cathode electrode 108 and the first metal layer 114A, the resistance can be reduced more than in a case of connecting with, for example, the second metal layer 114B including an aluminum-copper alloy due to a reduction effect of titanium.

Next, an outline of manufacturing processes of the wiring structure of the metal wiring 114 according to Example 3 will be described with reference to FIG. 11.

Figure 11A:
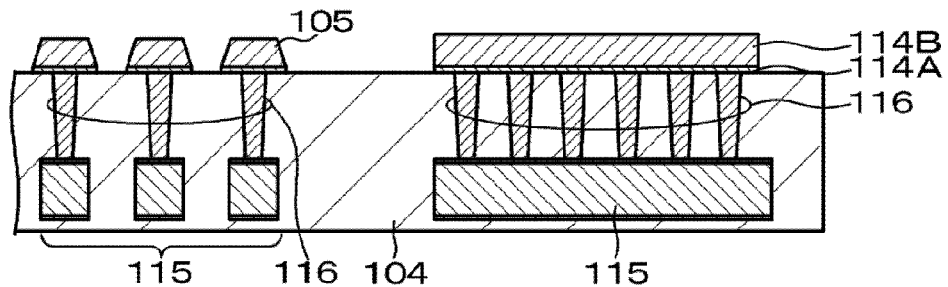
FIG. 11A to FIG. 11D are process views illustrating manufacturing steps of the wiring structure of the metal wiring according to Example 3.
Figure 11B:
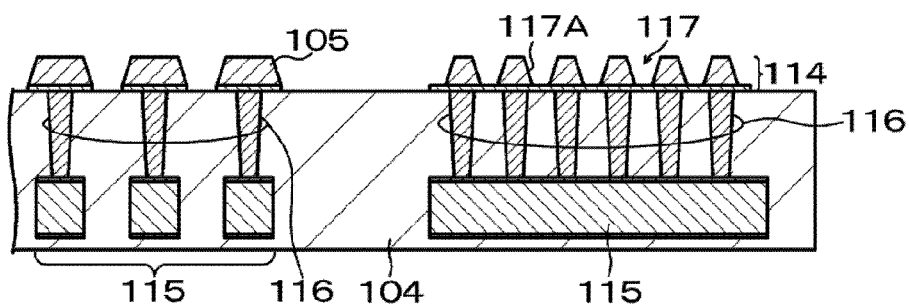
Figure 11C:
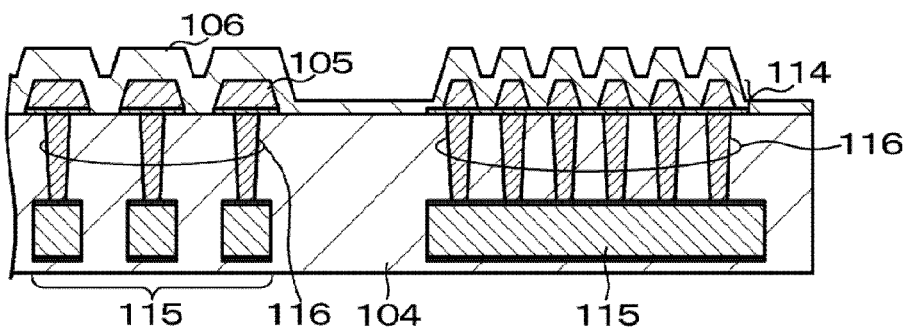

After forming the lower wiring 115 and the contact portions 116, and forming the first metal layer 114A and the second metal layer 114B for forming the anode electrodes 105 and the metal wiring 114, pattern processing by PR/DET is performed on a region other than the metal wiring 114 (step in FIG. 11A). Next, PR/DET is performed on a region of the metal wiring 114, so as to form in the metal wiring 114 recesses 117 having a tapered shape with a taper angle θ that allows maintaining a film thickness of the cathode electrode 108 equal to or larger than a certain value (step in FIG. 11B). At this time, a process for leaving the first metal layer 114A as a lower layer in the metal wiring 114 having a two-layer structure of the first metal layer 114A and the second metal layer 114B is performed.

Figure 11D:
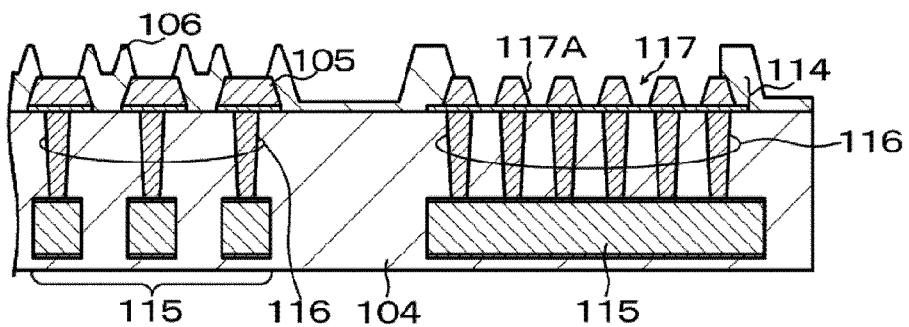

Next, an organic insulating layer 106 as an uppermost layer is formed (step in FIG. 11C), and then the organic insulating layer 106 on the anode electrodes 105 and the metal wiring 114 is opened (step in FIG. 11D). Thereafter, a cathode electrode 108 is formed on the anode electrodes 105 and the metal wiring 114 by a vapor deposition process.

Example 4

Figure 12:
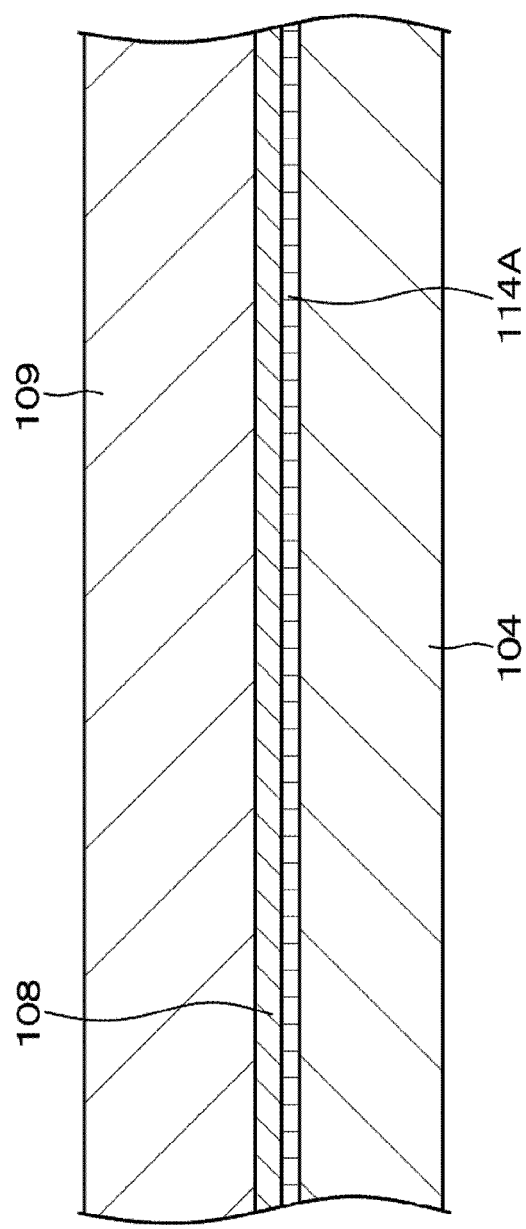
FIG. 12 is a cross-sectional view illustrating a summary of a wiring structure of a metal wiring according to Example 4.

Example 4 is a modification example of Example 2, in which the wiring structure of the metal wiring 114 in the contact region is a one-layer structure. FIG. 12 illustrates a cross-sectional view of a wiring structure of a metal wiring 114 according to Example 4.

The wiring structure of the metal wiring 114 according to Example 4 has a structure in which the second metal layer 114B in the contact region is entirely removed and the first metal layer 114A is entirely left. That is, the wiring structure of the metal wiring 114 according to Example 4 has a one-layer structure including the first metal layer 114A. Then, the cathode electrode 108 is formed on the first metal layer 114A by a vapor deposition process.

As described above, the wiring structure of the metal wiring 114 according to Example 4 has a one-layer structure including only the first metal layer 114A. Thus, in a case where, for example, titanium is used as the material for the first metal layer 114A, the contact resistance between the cathode electrode 108 and the first metal layer 114A can be reduced more than in a case where the cathode electrode 108 and the first metal layer 114A partially contact each other, due to a reducing effect of titanium.

Next, an outline of manufacturing processes of the wiring structure of the metal wiring 114 according to Example 4 will be described with reference to FIG. 13.

Figure 13A:
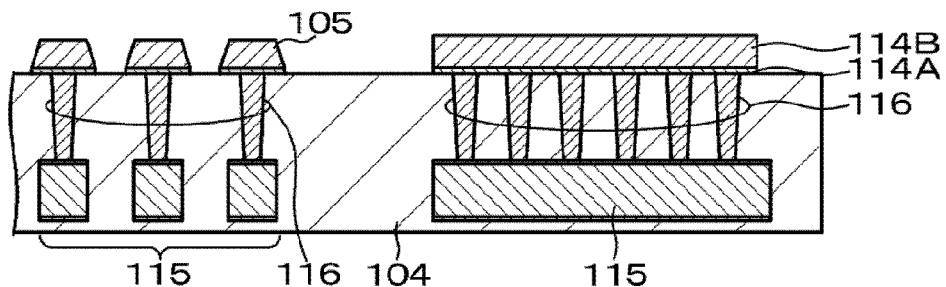
FIG. 13A to FIG. 13D are process views illustrating manufacturing steps of the wiring structure of the metal wiring according to Example 4.
Figure 13B:
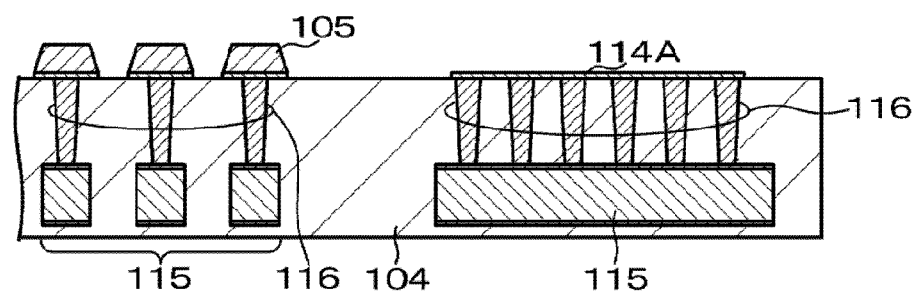
Figure 13C:
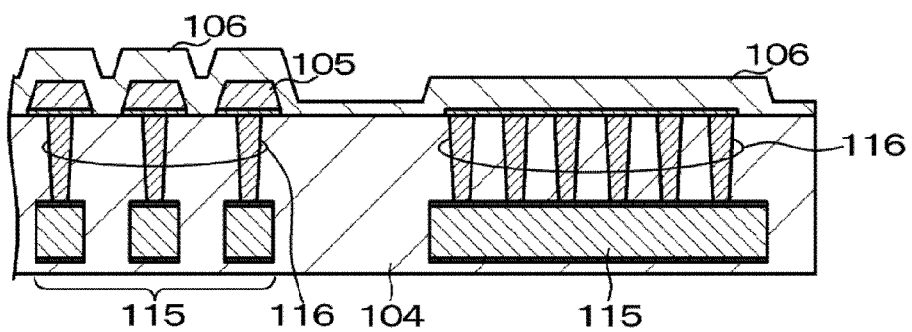

After forming the lower wiring 115 and the contact portions 116, and forming the first metal layer 114A and the second metal layer 114B for forming the anode electrodes 105 and the metal wiring 114, pattern processing by PR/DET is performed on a region other than the metal wiring 114 (step in FIG. 13A). Next, PR/DET is performed on a region of the metal wiring 114 to scrape the second metal layer 114B as an upper layer, so as to leave the first metal layer 114A as a lower layer (step in FIG. 13B).

Figure 13D:
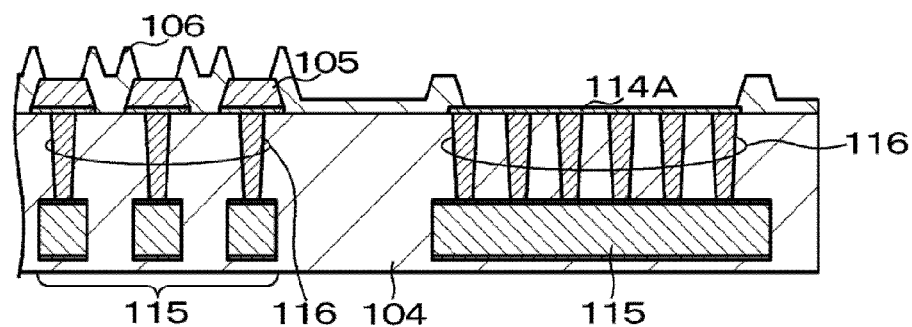

Next, an organic insulating layer 106 as an uppermost layer is formed (step in FIG. 13C), and then the organic insulating layer 106 on the anode electrodes 105 and the metal wiring 114 is opened (step in FIG. 13D). Thereafter, a cathode electrode 108 is formed on the anode electrodes 105 and the metal wiring 114 by a vapor deposition process.

Example 5

Example 5 is an example in which a wiring structure of a metal wiring 114 also serves as a contact with a lower wiring 115. FIG. 14 illustrates a cross-sectional view of a wiring structure of a metal wiring 114 according to Example 5.

In the wiring structure of the metal wiring 114 according to Example 5, an interlayer insulating layer 104 as a base is processed to form recesses 117 having a tapered shape with a taper angle θ so as to reach the lower wiring 115, and a metal wiring 114 having a two-layer structure including a first metal layer 114A and a second metal layer 114B is provided in the recesses 117. The recesses 117 formed in the interlayer insulating layer 104 have an angle that allows maintaining the film thickness of the cathode electrode 108 equal to or larger than a certain value, for example, a taper angle θ of 60 degrees or less, preferably 55 degrees or less. The taper angles θ of the recesses 117 formed in the interlayer insulating layer 104 are similar in the examples as described later.

The wiring structure of the metal wiring 114 according to Example 5 has an uneven structure by being provided in the recesses 117 formed in the interlayer insulating layer 104. On the metal wiring 114 having the uneven structure, the cathode electrode 108 is formed in a self-aligned manner. Then, contact portions of anode electrodes 105 includes a contact metal material such as tungsten, whereas the wiring structure of the metal wiring 114 according to Example 5 is electrically connected to the lower wiring 115, to thereby serve also as a contact with the lower wiring 115.

As described above, the wiring structure of the metal wiring 114 according to Example 5 has a structure in which the interlayer insulating layer 104 is processed to form the recesses 117 with a depth reaching the lower wiring 115. Thus, by forming the recesses 117 with a depth reaching the lower wiring 115, areas of the tapered surfaces 117A of the recesses 117 can be secured wider than in the case of Example 2. Thus, the contact area between the metal wiring 114 and the cathode electrode can be further increased, the contact resistance can be reduced by that amount, and thus the frame of the display panel 70 can be narrowed.

Next, an outline of manufacturing processes of the wiring structure of the metal wiring 114 according to Example 5 will be described with reference to FIG. 15.

Figure 15A:
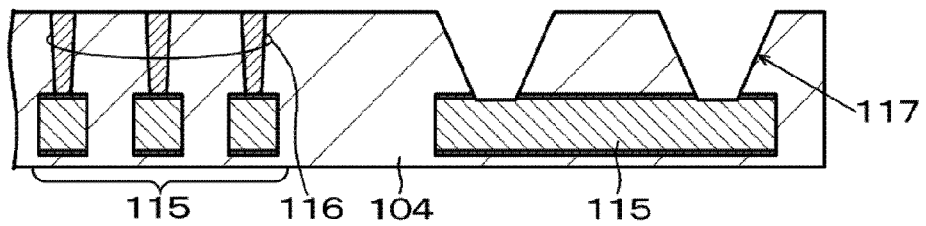
FIG. 15A to FIG. 15D are process views illustrating manufacturing steps of the wiring structure of the metal wiring according to Example 5.
Figure 15B:
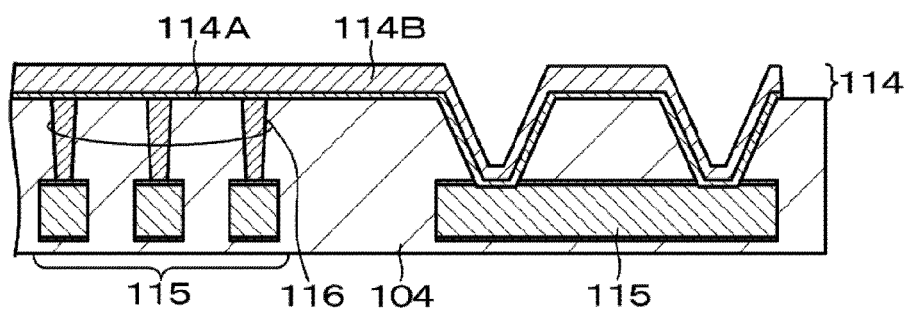

After forming contact portions 116 of the lower wiring 115 and the anode electrodes 105, PR/ET is performed on the interlayer insulating layer 104 to form the recesses 117 having a tapered shape with a taper angle θ corresponding to the contact opening (step in FIG. 15A). Next, a first metal layer 114A and a second metal layer 114B for forming the anode electrodes 105 and the metal wiring 114 are formed on the entire surface of the interlayer insulating layer 104 including the recesses 117 (step in FIG. 15B).

Figure 15C:
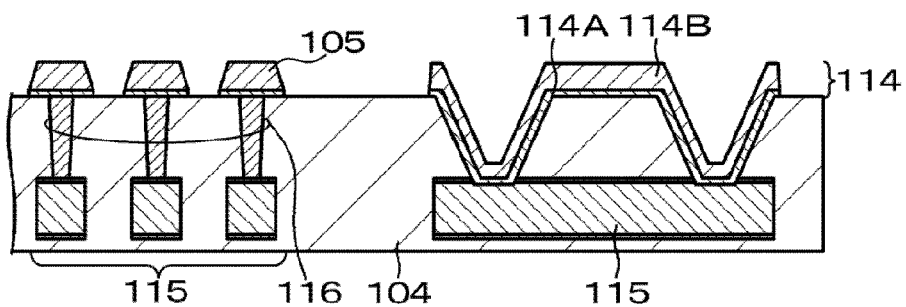
Figure 15D:
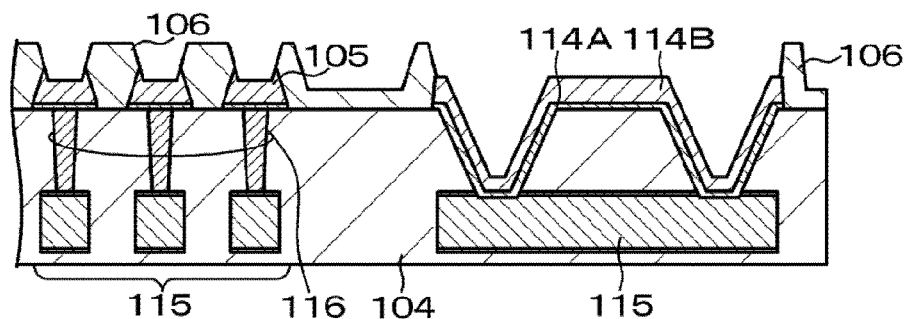

Next, PR/DET is carried out so as to perform pattern processing for the anode electrodes 105 and the metal wiring 114 (step in FIG. 15C). Next, an organic insulating layer 106 as an uppermost layer is formed, and then the organic insulating layer 106 on the anode electrodes 105 and the metal wiring 114 is opened (step in FIG. 15D). Thereafter, a cathode electrode 108 is formed on the anode electrodes 105 and the metal wiring 114 by a vapor deposition process.

Example 6

Figure 16:
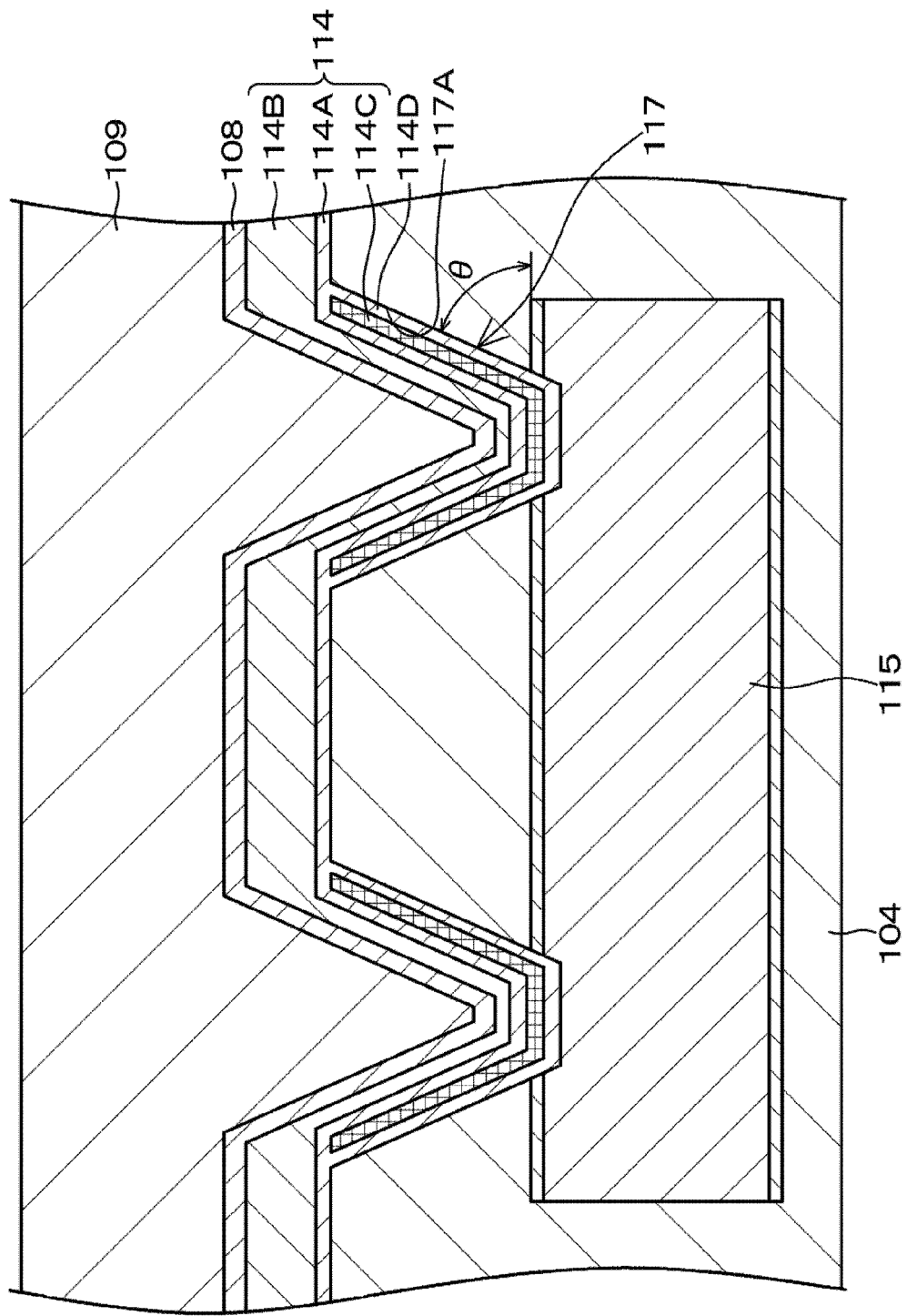
FIG. 16 is a cross-sectional view illustrating a summary of a wiring structure of a metal wiring according to Example 6.

Example 6 is a modification example of Example 5, and is an example in which the wiring structure of the metal wiring 114 that also serves as a contact with the lower wiring 115 is a three-layer structure. FIG. 16 illustrates a cross-sectional view of a wiring structure of a metal wiring 114 according to Example 6.

The wiring structure of the metal wiring 114 according to Example 6 has an uneven structure by being provided in the recesses 117 formed in the interlayer insulating layer 104, on which a cathode electrode 108 is formed in a self-aligned manner, similarly to the wiring structure of the metal wiring 114 according to Example 5. In addition, the wiring structure of the metal wiring 114 according to Example 6 has a three-layer structure in which a third metal layer 114C, a first metal layer 114A, and a second metal layer 114B are stacked in this order in the recesses 117. Note that a metal layer 114D for embedding in a contact is provided under the third metal layer 114C. Materials for the metal layer 114D for embedding in the contact can include titanium (Ti) and titanium nitride (TiN).

As a material for the third metal layer 114C, tungsten (W) can be exemplified. However, it is not limited to tungsten. Other materials for the third metal layer 114C can include copper (Cu).

As described above, the wiring structure of the metal wiring 114 according to Example 6 is different from the wiring structure of the metal wiring 114 according to Example 5 in that the structure in the recesses 117 is a three-layer structure, but operation and effect similar to those of the wiring structure of the metal wiring 114 according to Example 5 can be obtained. That is, since the recesses 117 are formed with a depth reaching the lower wiring 115, the contact area between the metal wiring 114 and the cathode electrode can be further increased, and the contact resistance can be reduced by that amount. Thus, the frame of the display panel 70 can be narrowed.

Next, an outline of manufacturing processes of the wiring structure of the metal wiring 114 according to Example 6 will be described with reference to FIG. 17.

Figure 17A:
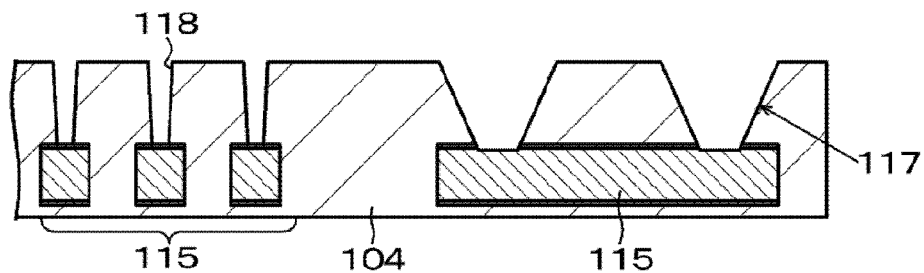
FIG. 17A to FIG. 17D are process views illustrating manufacturing steps of the wiring structure of the metal wiring according to Example 6.

After forming the lower wiring 115, PR/ET is applied to the interlayer insulating layer 104 to form contact openings 118 for the anode electrodes 105 and the recesses 117 having a tapered shape with a taper angle θ (step in FIG. 17A). Note that there is no limitation on the taper angle θ of the recesses 117 with respect to the contact openings 118 for the anode electrodes 105.

Figure 17B:
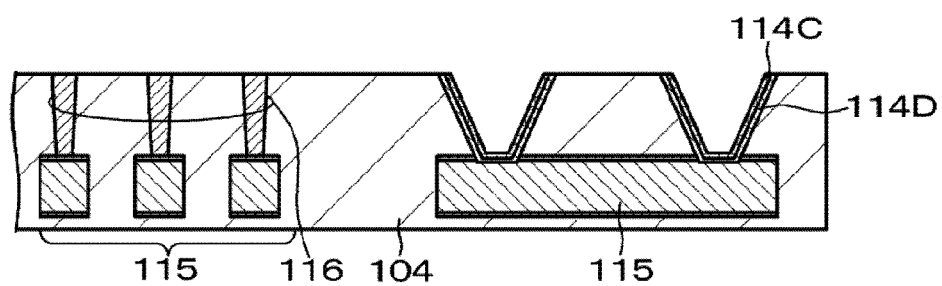

Next, a metal material (for example, tungsten) is embedded in the contact openings 118 for the anode electrodes 105, a metal layer 114D for embedding in a contact is formed in the recesses 117, and thereafter the third metal layer 114C is formed by a metal material (for example, tungsten) (step in FIG. 17B). Note that the metal layer 114D between a recess 117 and a recess 117 is cut and removed during processing. This is similar in the examples as described later.

Figure 17C:
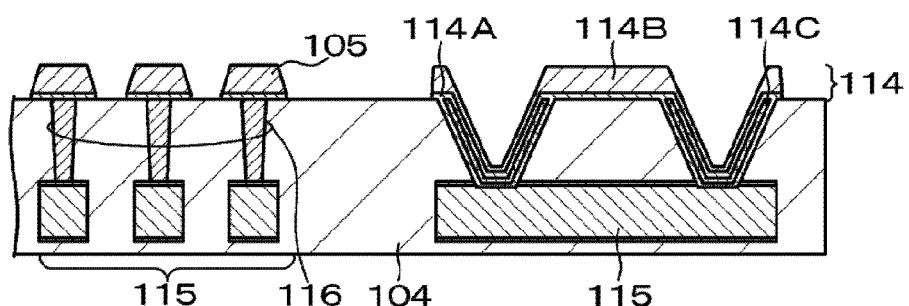
Figure 17D:
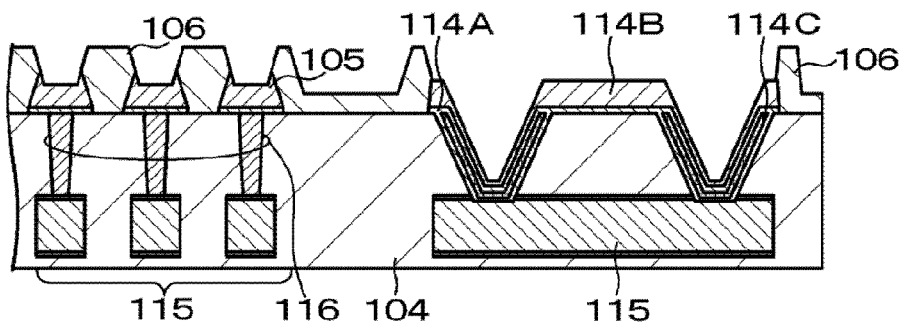

Next, after the first metal layer 114A and the second metal layer 114B are sequentially formed, PR/DET is carried out so as to perform pattern processing for the anode electrodes 105 and the metal wiring 114 (step in FIG. 17C). Next, an organic insulating layer 106 as an uppermost layer is formed, and then the organic insulating layer 106 on the anode electrodes 105 and the metal wiring 114 is opened (step in FIG. 17D). Thereafter, a cathode electrode 108 is formed on the anode electrodes 105 and the metal wiring 114 by a vapor deposition process.

Example 7

Figure 18:
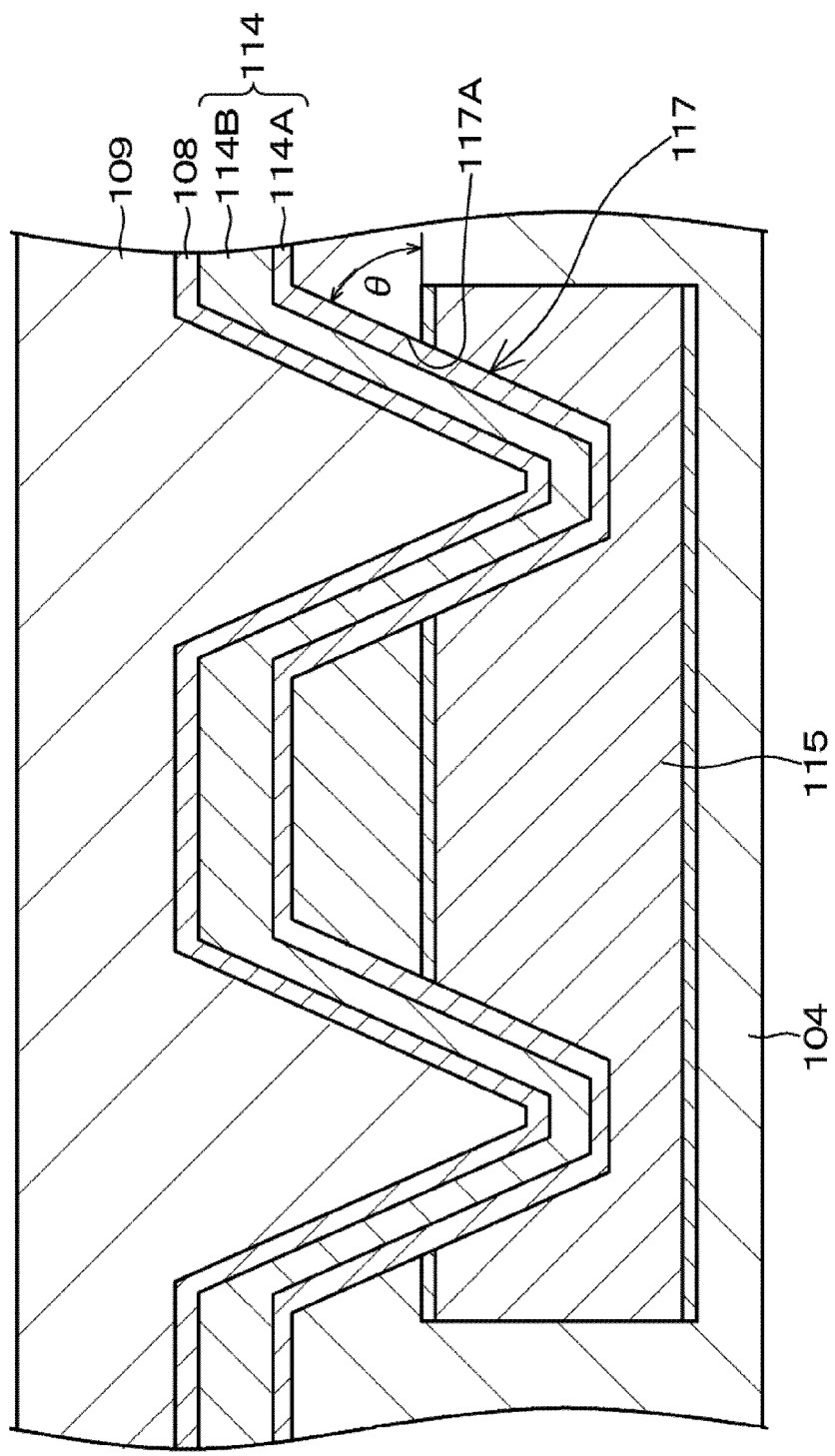
FIG. 18 is a cross-sectional view illustrating a summary of a wiring structure of a metal wiring according to Example 7.

Example 7 is a modification example of Example 5, and is an example in which the contact area in the two-layer wiring structure of the metal wiring 114 is increased. FIG. 18 illustrates a cross-sectional view of a wiring structure of a metal wiring 114 according to Example 7.

In the wiring structure of the metal wiring 114 according to Example 7, the interlayer insulating layer 104 and the lower wiring 115 are processed to form recesses 117 having a tapered shape with a taper angle θ and a depth reaching the inside of the lower wiring 115, so as to provide a two-layer wiring structure of the metal wiring 114 according to Example 5 in the recesses 117. That is, the wiring structure of the metal wiring 114 according to Example 7 is a structure in which the two-layer wiring structure of the metal wiring 114 according to Example 5 is formed with a depth reaching the inside of the lower wiring 115.

As described above, the wiring structure of the metal wiring 114 according to Example 7 has a structure in which the interlayer insulating layer 104 and the lower wiring 115 are processed to form the recesses 117 with a depth reaching the inside of the lower wiring 115. As described above, by forming the recesses 117 with a depth reaching the inside of the lower wiring 115, the areas of the tapered surfaces 117A of the recesses 117 can be secured wider than in the case of Example 5. Thus, the contact area between the metal wiring 114 and the cathode electrode can be further increased, the contact resistance can be reduced by that amount, and thus the frame of the display panel 70 can be narrowed.

Next, an outline of manufacturing processes of the wiring structure of the metal wiring 114 according to Example 7 will be described with reference to FIG. 19.

Figure 19A:
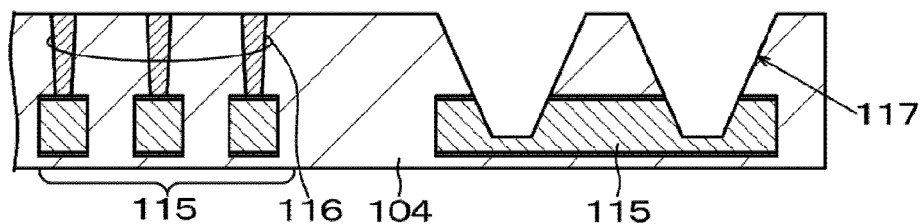
FIG. 19A to FIG. 19D are process views illustrating manufacturing steps of the wiring structure of the metal wiring according to Example 7.
Figure 19B:
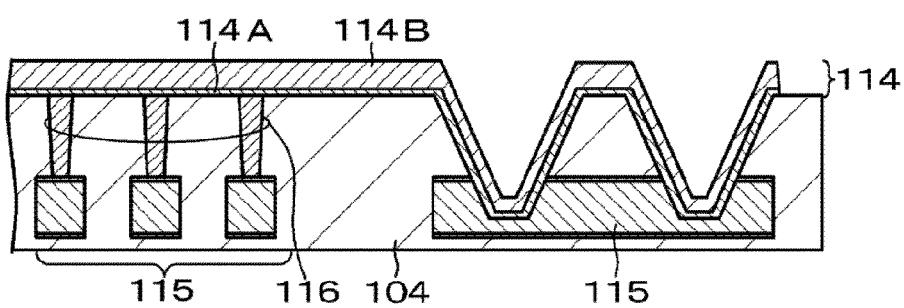

After forming the contact portions 116 of the lower wiring 115 and the anode electrodes 105, PR/ET is performed on the interlayer insulating layer 104 and the lower wiring 115 to form the recesses 117 having a tapered shape with a taper angle θ corresponding to the contact opening with a depth reaching the inside of the lower wiring 115 (step in FIG. 19A). Next, a first metal layer 114A and a second metal layer 114B for forming the anode electrodes 105 and the metal wiring 114 are formed on the entire surface of the interlayer insulating layer 104 including the recesses 117 (step in FIG. 19B).

Figure 19C:
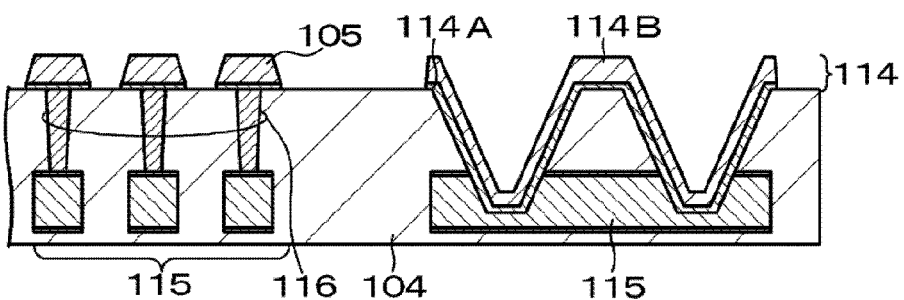
Figure 19D:
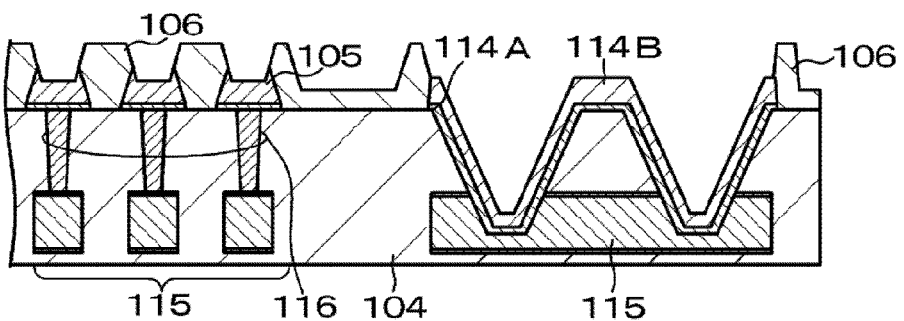

Next, PR/DET is carried out so as to perform pattern processing for the anode electrodes 105 and the metal wiring 114 (step in FIG. 19C). Next, an organic insulating layer 106 as an uppermost layer is formed, and then the organic insulating layer 106 on the anode electrodes 105 and the metal wiring 114 is opened (step in FIG. 19D). Thereafter, a cathode electrode 108 is formed on the anode electrodes 105 and the metal wiring 114 by a vapor deposition process.

Example 8

Figure 20:
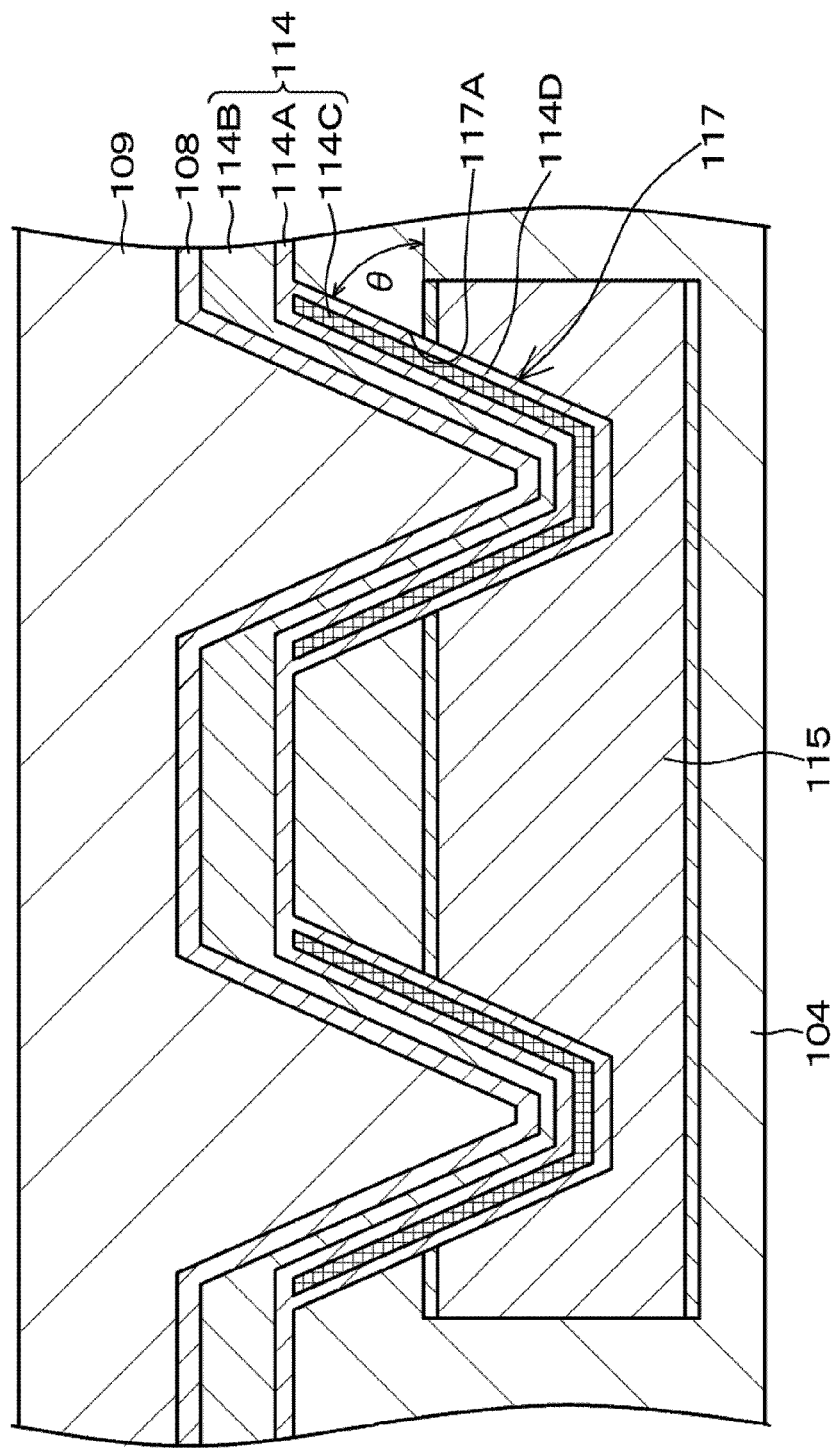
FIG. 20 is a cross-sectional view illustrating a summary of a wiring structure of a metal wiring according to Example 8.

Example 8 is a modification example of Example 6, and is an example in which the contact area in a three-layer wiring structure of the metal wiring 114 is increased. FIG. 20 illustrates a cross-sectional view of a wiring structure of a metal wiring 114 according to Example 8.

In the wiring structure of the metal wiring 114 according to Example 8, the interlayer insulating layer 104 and the lower wiring 115 are processed to form recesses 117 having a tapered shape with a taper angle θ and a depth reaching the inside of the lower wiring 115, so as to provide a three-layer wiring structure of the metal wiring 114 according to Example 6 in the recesses 117. That is, the wiring structure of the metal wiring 114 according to Example 7 is a structure in which the three-layer wiring structure of the metal wiring 114 according to Example 6 is formed with a depth reaching the inside of the lower wiring 115.

As described above, the wiring structure of the metal wiring 114 according to Example 8, similarly to the wiring structure of the metal wiring 114 according to Example 7, has a structure in which the interlayer insulating layer 104 and the lower wiring 115 are processed to form the recesses 117 with a depth reaching the inside of the lower wiring 115. Thus, similarly to the wiring structure of the metal wiring 114 according to Example 7, the contact area between the metal wiring 114 and the cathode electrode can be further increased, the contact resistance can be reduced by that amount, and thus the frame of the display panel 70 can be narrowed.

Next, an outline of manufacturing processes of the wiring structure of the metal wiring 114 according to Example 8 will be described with reference to FIG. 21.

Figure 21A:
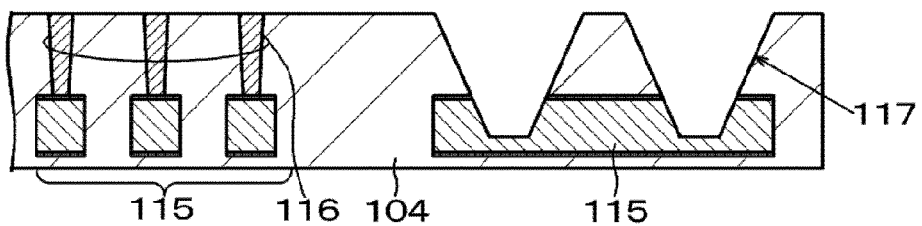
FIG. 21A to FIG. 21D are process views illustrating manufacturing steps of the wiring structure of the metal wiring according to Example 8.
Figure 21B:
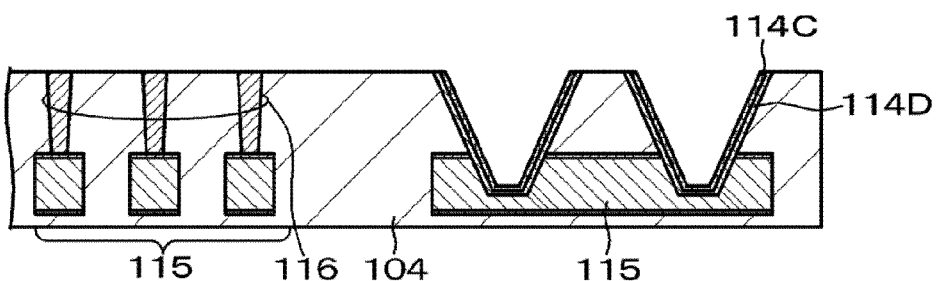

After forming the contact portions 116 of the lower wiring 115 and the anode electrodes 105, PR/ET is performed on the interlayer insulating layer 104 and the lower wiring 115 to form the recesses 117 having a tapered shape with a taper angle θ corresponding to the contact opening with a depth reaching the inside of the lower wiring 115 (step in FIG. 21A). Next, after forming a metal layer 114D for embedding in the contacts in the recesses 117, a third metal layer 114C is formed with a metal material (for example, tungsten) (step in FIG. 21B).

Figure 21C:
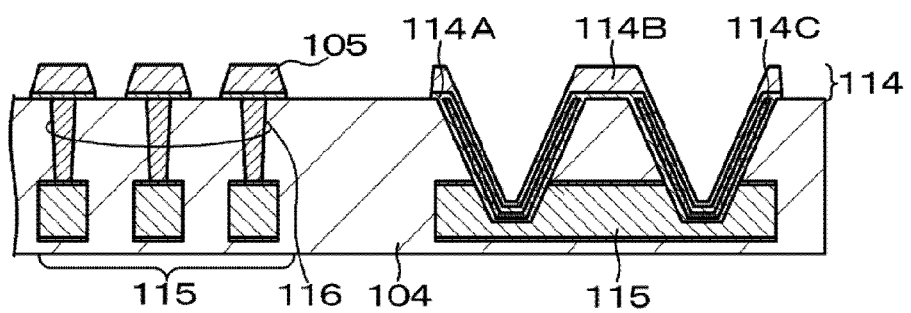
Figure 21D:
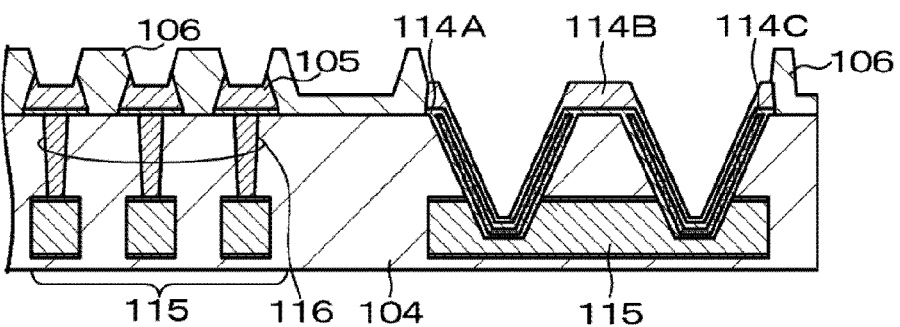

Next, after the first metal layer 114A and the second metal layer 114B are sequentially formed, PR/DET is carried out so as to perform pattern processing for the anode electrodes 105 and the metal wiring 114 (step in FIG. 21C). Next, an organic insulating layer 106 as an uppermost layer is formed, and then the organic insulating layer 106 on the anode electrodes 105 and the metal wiring 114 is opened (step in FIG. 21D). Thereafter, a cathode electrode 108 is formed on the anode electrodes 105 and the metal wiring 114 by a vapor deposition process.

Example 9

Figure 22:
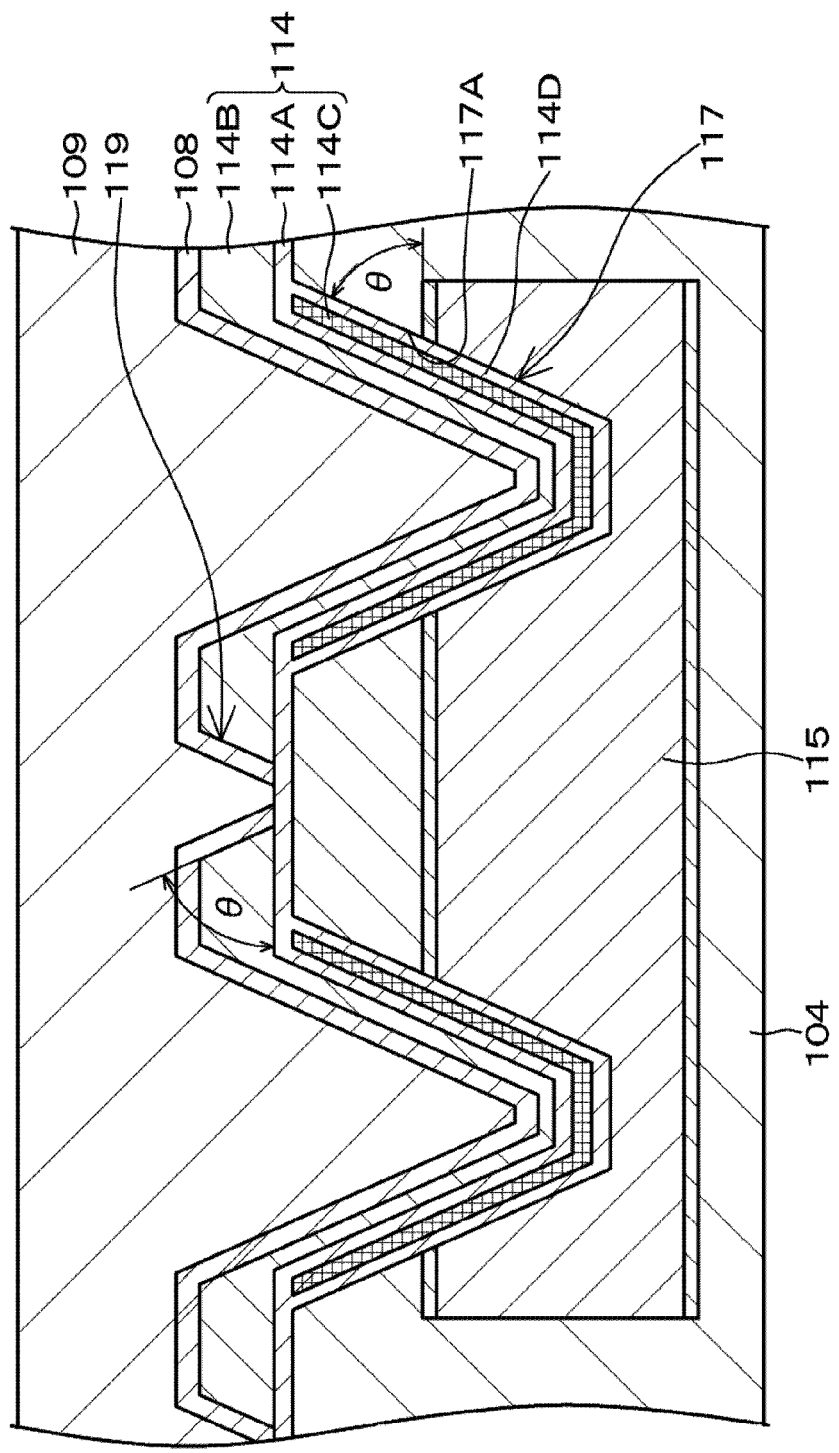
FIG. 22 is a cross-sectional view illustrating a summary of a wiring structure of a metal wiring according to Example 9.

Example 9 is an example of a combination of Example 3 and Example 8. FIG. 22 illustrates a cross-sectional view of a wiring structure of a metal wiring 114 according to Example 9.

In the wiring structure of the metal wiring 114 according to Example 9, recesses 117 having a tapered shape with a taper angle θ is formed with a depth reaching the inside of the lower wiring 115, and the three-layer wiring structure of the metal wiring 114 according to Example 8 is provided in the recesses 117. That is, in the wiring structure of the metal wiring 114 according to Example 9, in the metal wiring 114 having an uneven structure, recesses 117 have a three-layer wiring structure formed by stacking a first metal layer 114A, a third metal layer 114C, and a second metal layer 114B, and projections have a two-layer structure formed by stacking the first metal layer 114A and the second metal layer 11B.

In addition, the wiring structure of the metal wiring 114 according to Example 9 is a structure in which in the two-layer structure of the projections of the uneven structure, as in the case of Example 3, only the second metal layer 114B is processed to leave the first metal layer 114A, and recesses 119 having a tapered shape with a taper angle θ is formed as second recesses so that bottom surfaces thereof are in contact with the first metal layer 114A. Then, a cathode electrode 108 is formed on the metal wiring 114 including the recesses 117 and recesses 119 by a vapor deposition process.

As described above, the wiring structure of the metal wiring 114 according to Example 9 is a structure in which only the second metal layer 114B is processed in the two-layer structure of the projections of the metal wiring 114 according to Example 8, and the recesses 119 are formed while leaving the first metal layer 114A. Thus, the contact area between the metal wiring 114 and the cathode electrode can be increased as compared with a case where the projections have flat surfaces as in Example 8. Consequently, as compared with the wiring structure of the metal wiring 114 according to Example 8, the contact resistance can be reduced by an amount that the contact area between the metal wiring 114 and the cathode electrode can be increased, and thus the frame of the display panel 70 can be narrowed.

Next, an outline of manufacturing processes of the wiring structure of the metal wiring 114 according to Example 9 will be described with reference to FIG. 23.

Figure 23A:
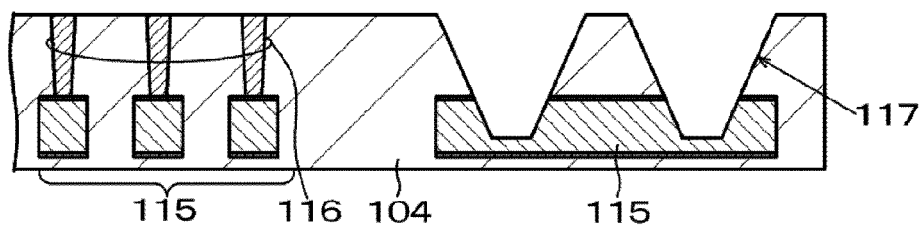
FIG. 23A to FIG. 23D are process views illustrating manufacturing steps of the wiring structure of the metal wiring according to Example 9.
Figure 23B:
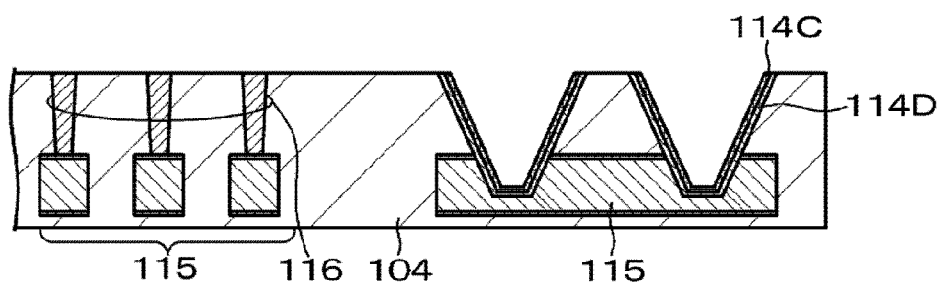

After forming the contact portions 116 of the lower wiring 115 and the anode electrodes 105, PR/ET is performed on the interlayer insulating layer 104 and the lower wiring 115 to form the recesses 117 having a tapered shape with a taper angle θ corresponding to the contact opening with a depth reaching the inside of the lower wiring 115 (step in FIG. 23A). Next, after forming a metal layer 114D for embedding in the contacts in the recesses 117, a third metal layer 114C is formed with a metal material (for example, tungsten) (step in FIG. 23B).

Figure 23C:
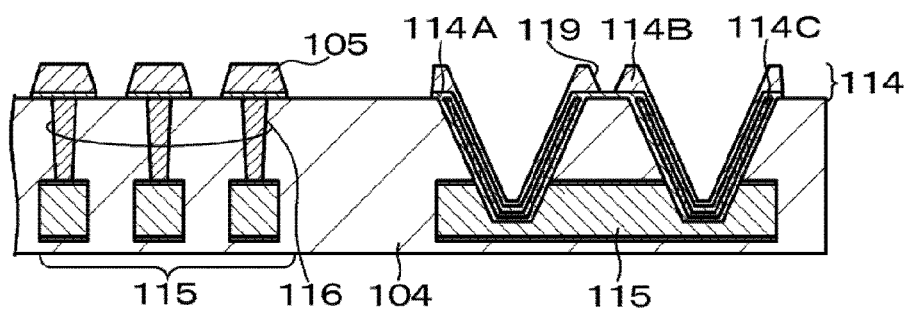

Next, after the first metal layer 114A and the second metal layer 114B are sequentially formed, PR/DET is performed, so as to pattern the anode electrodes 105 and the metal wiring 114 (step in FIG. 23C). At this time, the second metal layer 114B as an upper layer is processed with a taper angle θ to leave the first metal layer 114A as a lower layer. Thus, recesses 119 having a tapered shape with a taper angle θ is formed in the projections of the uneven structure of the metal wiring 114.

Figure 23D:
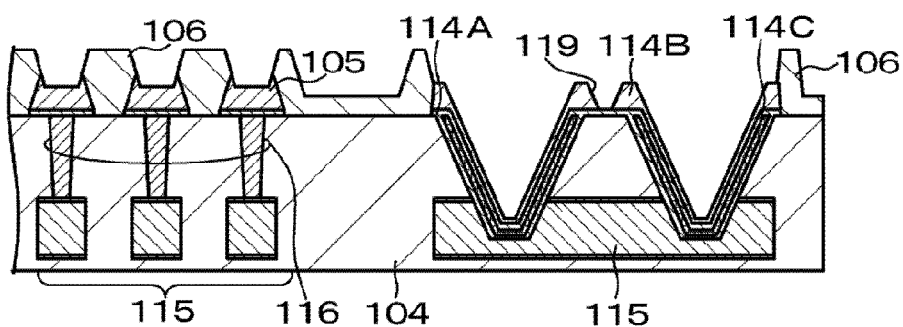

Next, an organic insulating layer 106 as an uppermost layer is formed, and then the organic insulating layer 106 on the anode electrodes 105 and the metal wiring 114 is opened (step in FIG. 23D). Thereafter, a cathode electrode 108 is formed on the anode electrodes 105 and the metal wiring 114 by a vapor deposition process.

Example 10

Example 10 is an example having intermediate electrodes for connecting to a cathode electrode. An outline of manufacturing processes of a display panel having a wiring structure of a metal wiring according to Example 10 will be described with reference to FIGS. 24, 25, and 26.

Figure 24A:
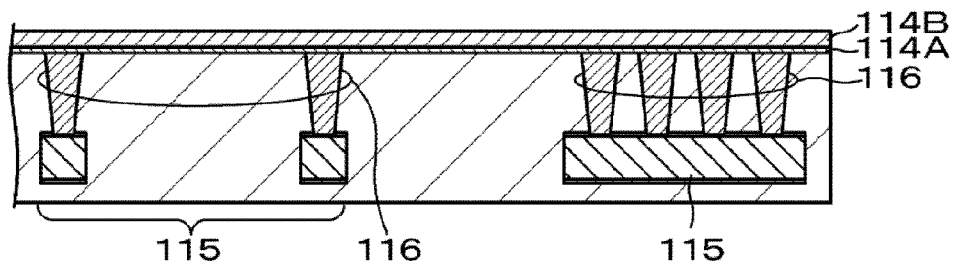
FIG. 24A to FIG. 24D are process views illustrating manufacturing steps (part 1) of a display panel having a wiring structure of a metal wiring according to Example 10.
Figure 24B:
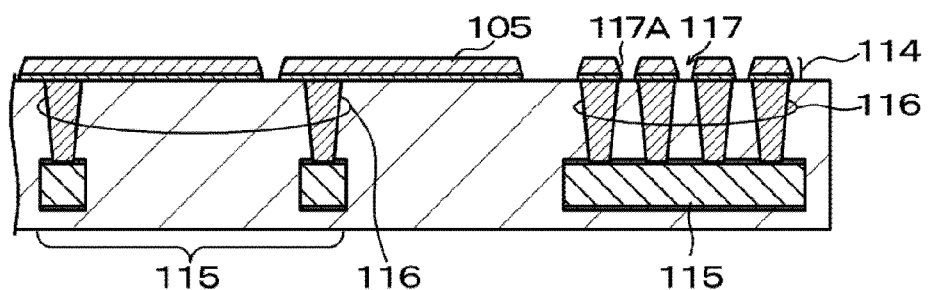
Figure 24C:
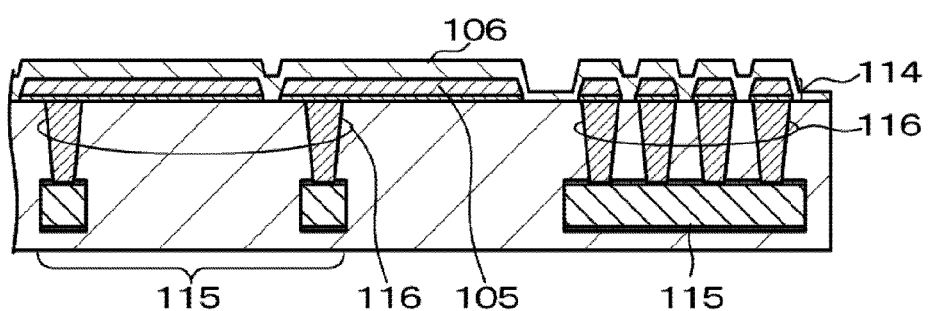
Figure 25A:
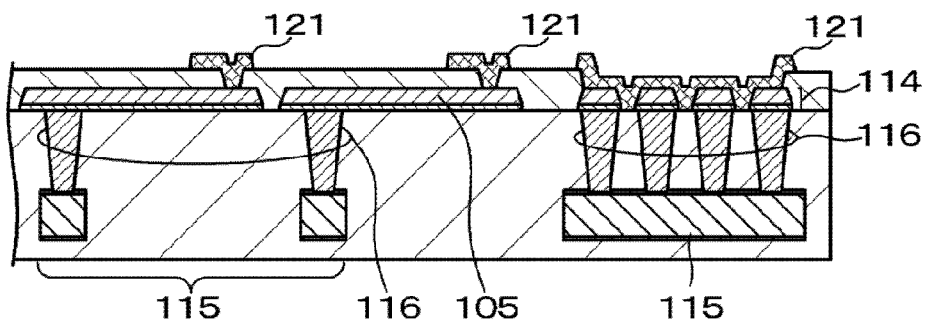
FIG. 25A to FIG. 25C are process views illustrating manufacturing steps (part 2) of the display panel having the wiring structure of the metal wiring according to Example 10.

After forming a lower wiring 115 and contact portions 116, a first metal layer 114A and a second metal layer 114B for forming anode electrodes 105 and a metal wiring 114 are formed (step in FIG. 24A). Next, PR/DET is performed to pattern the anode electrodes 105 and the metal wiring 114 (step in FIG. 24B). At this time, recesses 117 having a tapered surface 117A are formed in the metal wiring 114.

Figure 24D:
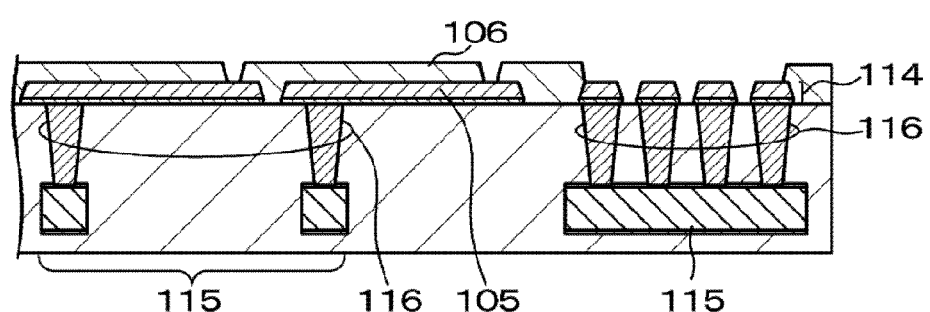

Next, an insulating layer 120 is formed using a material such as $SiO_2$ and SiN (step in FIG. 24C), and then the insulating layer 120 is processed to open portions on the anode electrodes 105 and a portion on the metal wiring 114 (step in FIG. 24D). At this time, a planarization step by CMP or the like may be added.

Figure 25B:
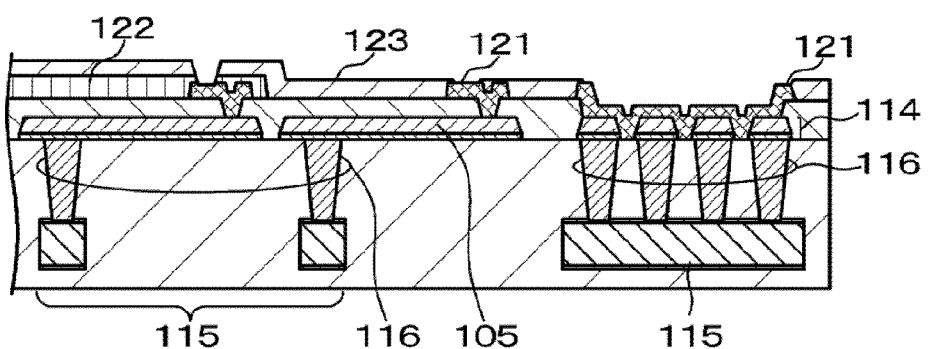
Figure 25C:
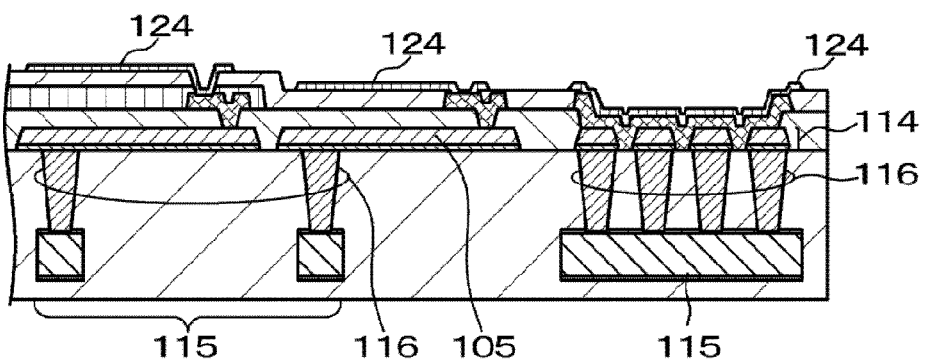

Next, intermediate electrodes 121 for connecting to a cathode electrode 108 as described later are formed using a material such as TiN (step in FIG. 25A), and then a first insulating layer 122 and a second insulating layer 123 for cavity are formed using a material such as SiO on the anode electrode 105 which is a reflective electrode (step in FIG. 25B). At this time, as illustrated, thicknesses of the insulating layers can be changed for every pixel.

Figure 26A:
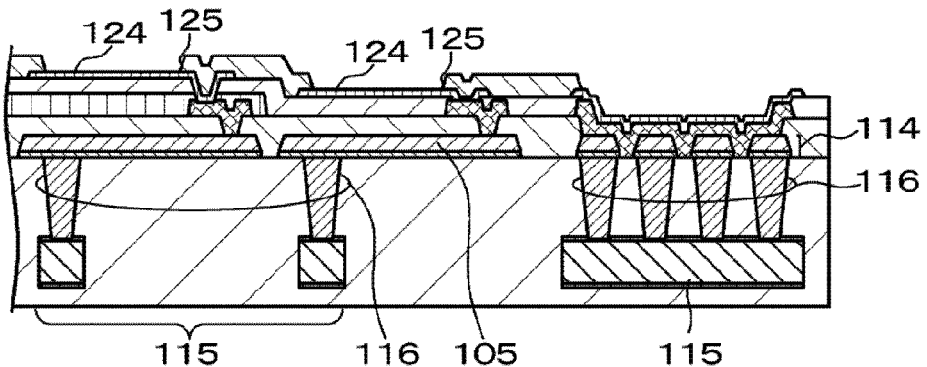
FIG. 26A to FIG. 26C are process views illustrating manufacturing steps (part 3) of the display panel having the wiring structure of the metal wiring according to Example 10.

Next, transparent electrodes 124 are formed using a material such as ITO and IZO (step in FIG. 25C), and then openings 125 are formed on the transparent electrodes 124 using a material such as SiO and SiN or an organic insulating film (step in FIG. 26A).

Figure 26B:
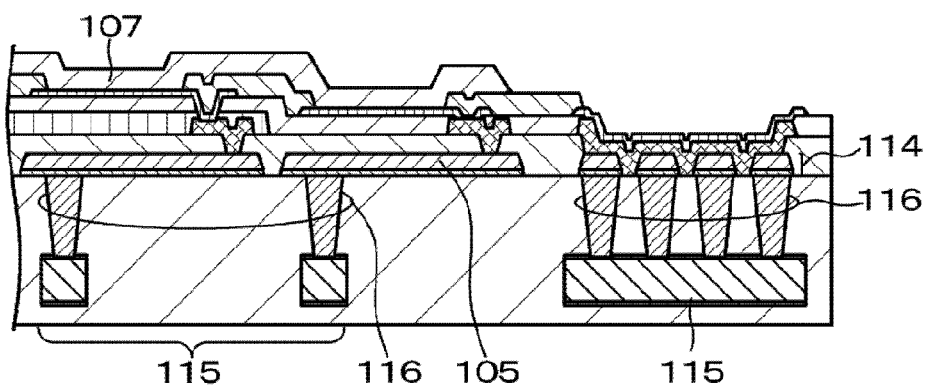
Figure 26C:
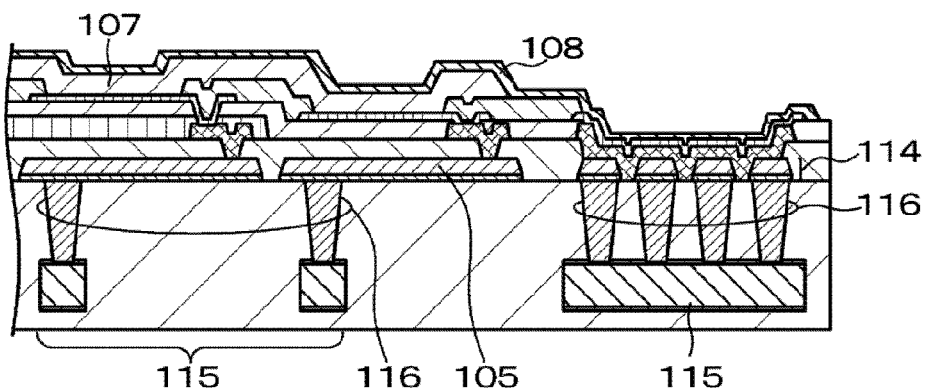

Next, an organic EL layer 107 is vapor-deposited in an effective pixel region (step in FIG. 26B). At the time of vapor deposition of the organic EL layer 107, mask vapor deposition or patterning is used so as not to form the organic EL layer 107 in a peripheral portion. Next, a cathode electrode 108 is formed using a material such as ITO, IZO, and MgAg (step in FIG. 26C).

Example 11

Example 11 is a modification example of Example 10, in which intermediate electrodes for connecting to a cathode electrode has an uneven structure. An outline of manufacturing processes of a display panel having a wiring structure of a metal wiring according to Example 11 will be described with reference to FIGS. 27, 28, and 29.

Figure 27A:
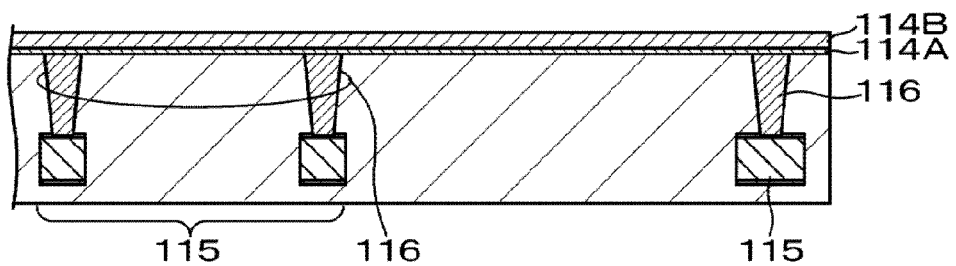
FIG. 27A to FIG. 27D are process views illustrating manufacturing steps (part 1) of a display panel having a wiring structure of a metal wiring according to Example 11.
Figure 27B:
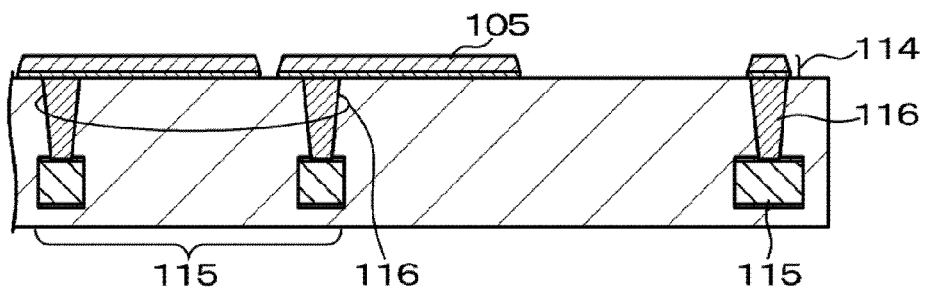
Figure 27C:
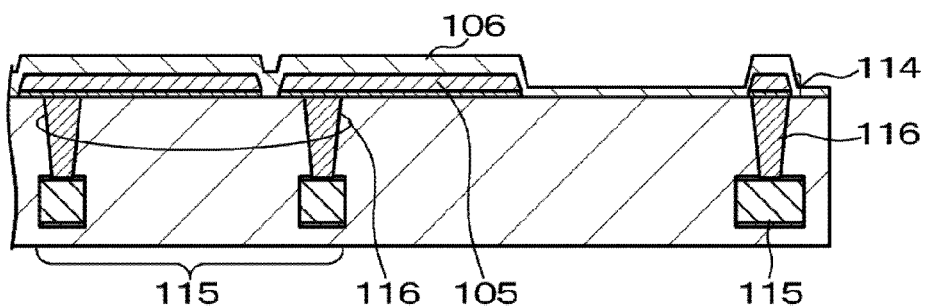

After forming a lower wiring 115 and contact portions 116, a first metal layer 114A and a second metal layer 114B for forming anode electrodes 105 and a metal wiring 114 are formed (step in FIG. 27A). Note that, in a case of this example, the contact portions 116 exist only on an outermost periphery of a region corresponding to the contact region X in FIG. 6. Next, PR/DET is performed to pattern the anode electrode 105 and the metal wiring 114 (step in FIG. 27B).

Figure 27D:
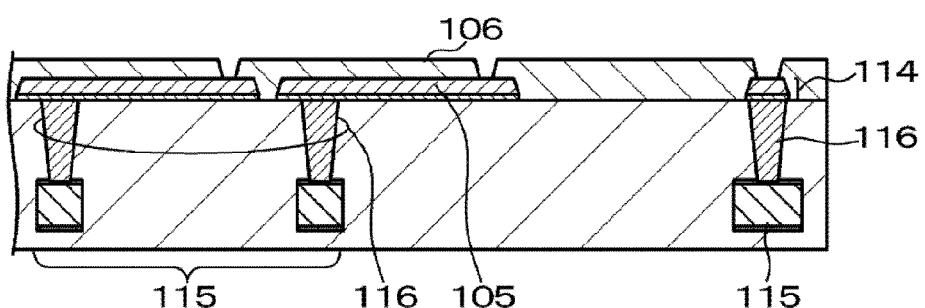

Next, an insulating layer 120 is formed using a material such as SiO₂ and SiN (step in FIG. 27C), and then the insulating layer 120 is processed to open portions on the anode electrodes 105 and a portion on the metal wiring 114 (step in FIG. 27D). At this time, a planarization step by CMP or the like may be added.

Figure 28A:
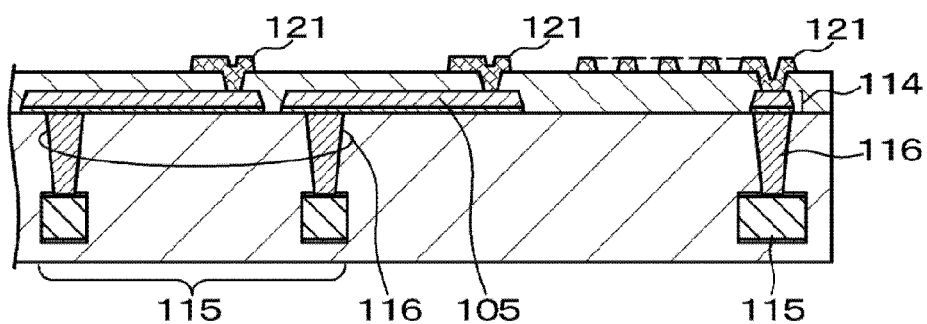
FIG. 28A to FIG. 28C are process views illustrating manufacturing steps (part 2) of the display panel having the wiring structure of the metal wiring according to Example 11.

Next, intermediate electrodes 121 for connecting to a cathode electrode 108 as described later are formed using a material such as TiN (step in FIG. 28A). In the step in FIG. 28A, the intermediate electrodes 121 in a region corresponding to the contact region X of FIG. 6 are further patterned to form an uneven structure. In this way, by making the intermediate electrodes 121 have an uneven structure, the contact area between the metal wiring 114 and the cathode electrode 108 can be increased.

Figure 28B:
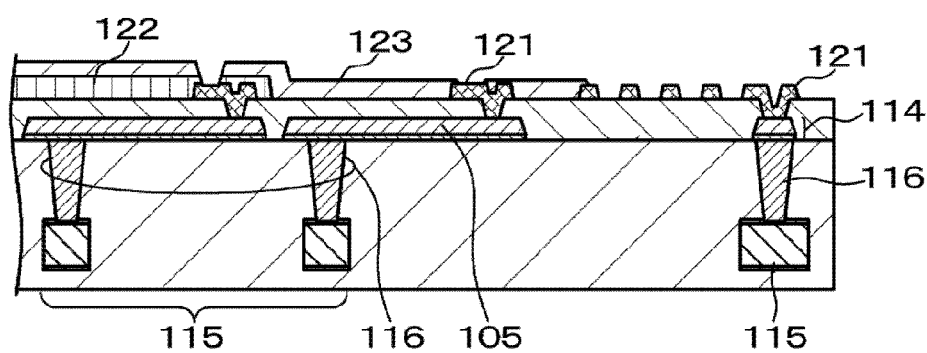
Figure 28C:
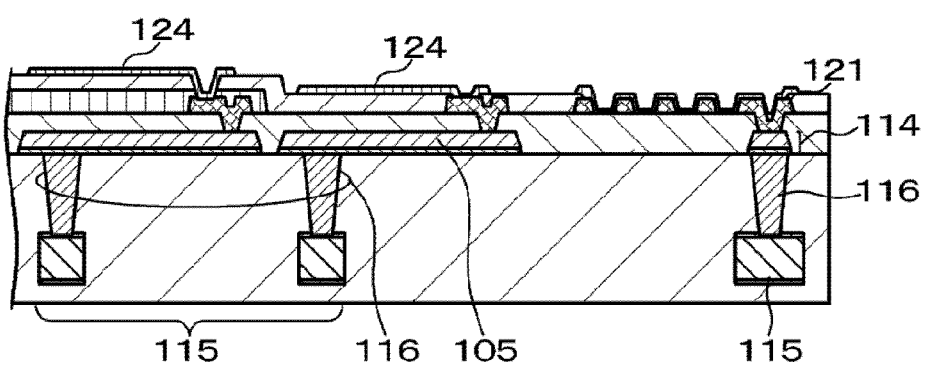

Next, a first insulating layer 122 and a second insulating layer 123 for cavity are formed using a material such as SiO on the anode electrodes 105 as reflective electrodes (step in FIG. 28B). At this time, as illustrated, thicknesses of the insulating layers can be changed for every pixel.

Figure 29A:
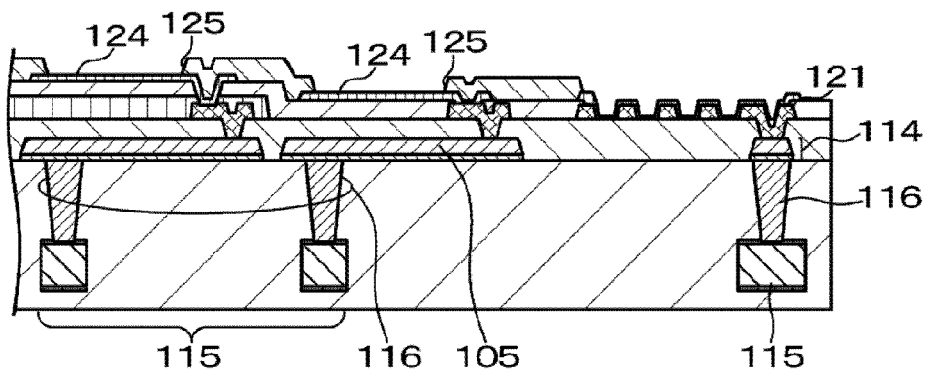
FIG. 29A to FIG. 29C are process views illustrating manufacturing steps (part 3) of the display panel having the wiring structure of the metal wiring according to Example 11.

Next, transparent electrodes 124 are formed using a material such as ITO and IZO (step in FIG. 28C), and then openings 125 are formed on the transparent electrodes 124 using a material such as SiO and SiN or an organic insulating film (step in FIG. 29A).

Figure 29B:
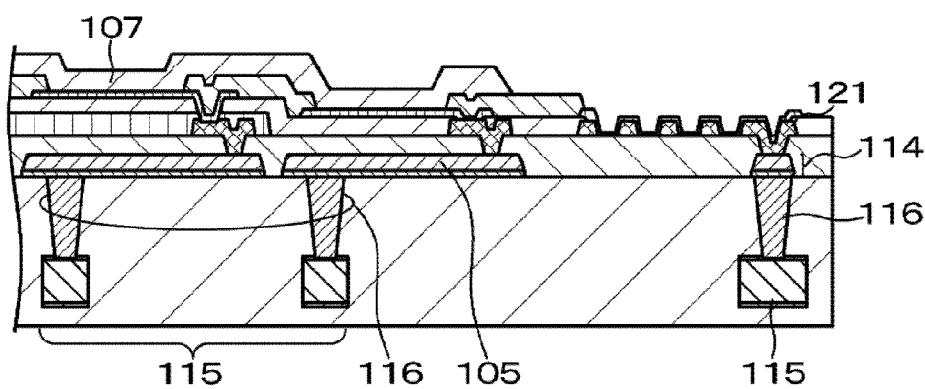
Figure 29C:
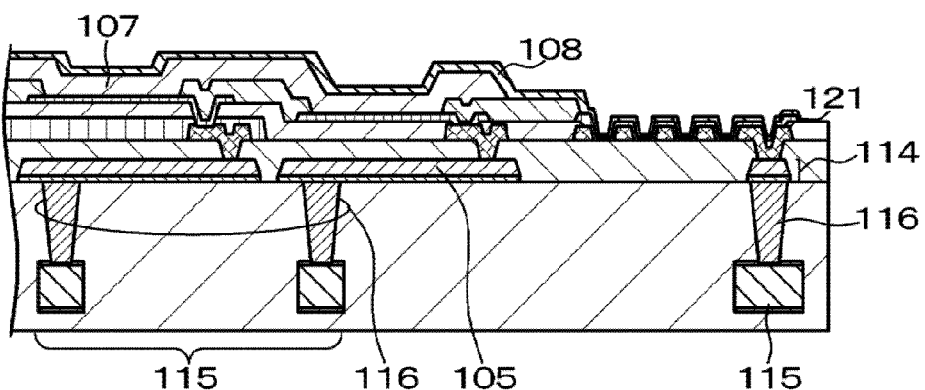

Next, an organic EL layer 107 is vapor-deposited in an effective pixel region (step in FIG. 29B). At the time of vapor deposition of the organic EL layer 107, mask vapor deposition or patterning is used so as not to form the organic EL layer 107 in a peripheral portion. Next, a cathode electrode 108 is formed using a material such as ITO, IZO, and MgAg (step in FIG. 29C).

Example 12

Example 12 is a modification example of Example 10, in which there is no intermediate electrode for connecting to a cathode electrode. An outline of manufacturing processes of a display panel having a wiring structure of a metal wiring according to Example 12 will be described with reference to FIGS. 30, 31, and 32.

Figure 30A:
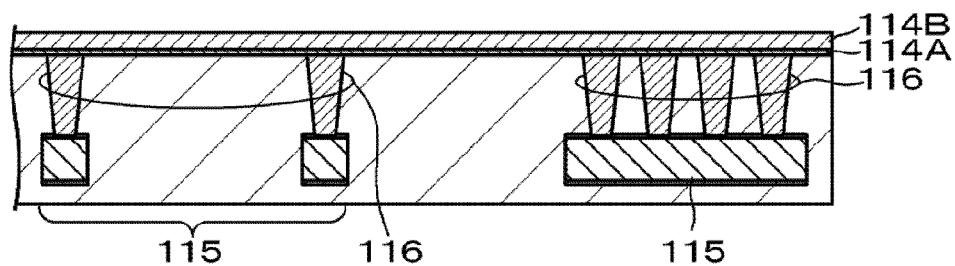
FIG. 30A to FIG. 30C are process views illustrating manufacturing steps (part 1) of a display panel having a wiring structure of a metal wiring according to Example 12.
Figure 30B:
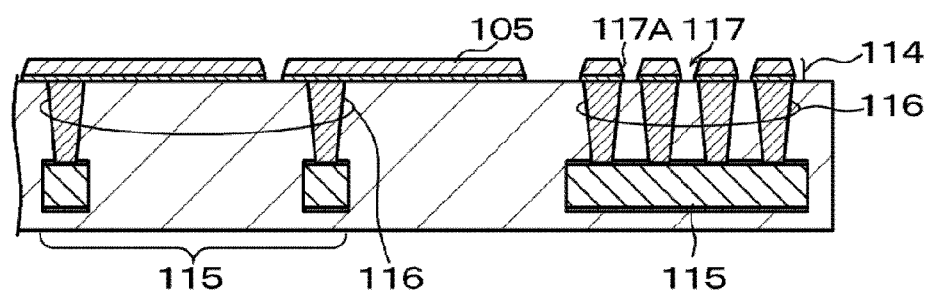
Figure 30C:
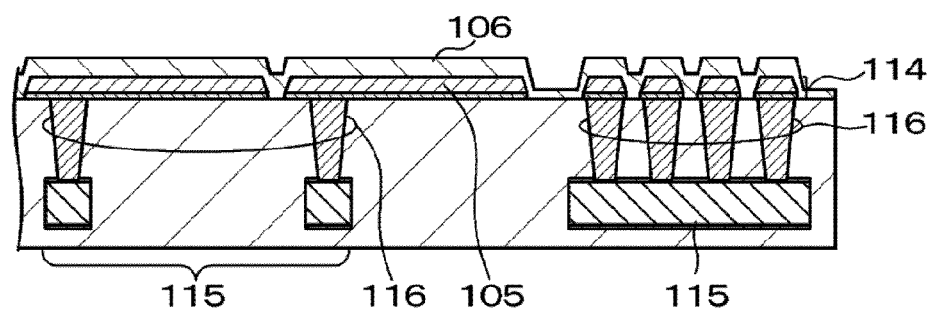

After forming a lower wiring 115 and contact portions 116, a first metal layer 114A and a second metal layer 114B for forming anode electrodes 105 and a metal wiring 114 are formed (step in FIG. 30A). Next, PR/DET is performed to pattern the anode electrodes 105 and the metal wiring 114 (step in FIG. 30B). At this time, recesses 117 having a tapered surface 117A are formed in the metal wiring 114.

Figure 31A:
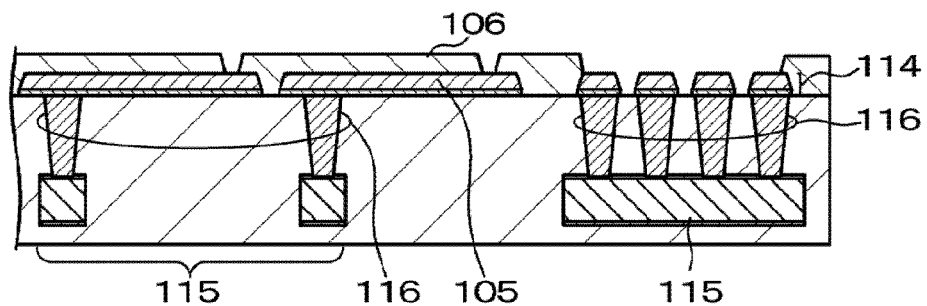
FIG. 31A to FIG. 31C are process views illustrating manufacturing steps (part 2) of the display panel having the wiring structure of the metal wiring according to Example 12.

Next, an insulating layer 120 is formed using a material such as SiO₂ and SiN (step in FIG. 30C), and then the insulating layer 120 is processed to open portions on the anode electrodes 105 and a portion on the metal wiring 114 (step in FIG. 31A). At this time, a planarization step by CMP or the like may be added.

Figure 31B:
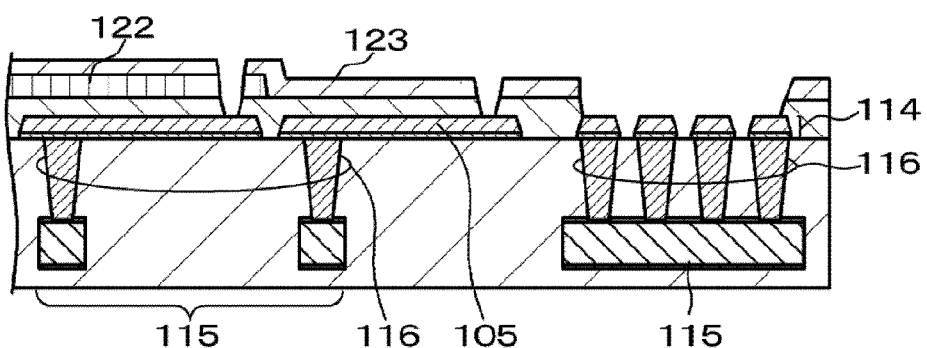
Figure 31C:
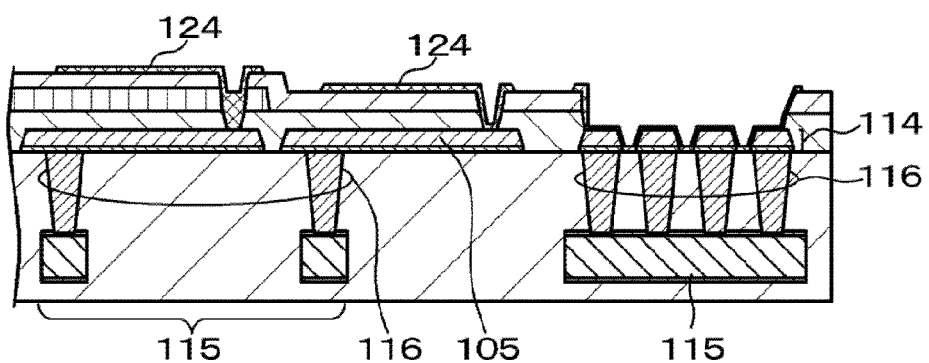

Next, a first insulating layer 122 and a second insulating layer 123 for cavity are formed using a material such as SiO on the anode electrodes 105 as reflective electrodes (step in FIG. 31B). At this time, as illustrated, thicknesses of the insulating layers can be changed for every pixel.

Figure 32A:
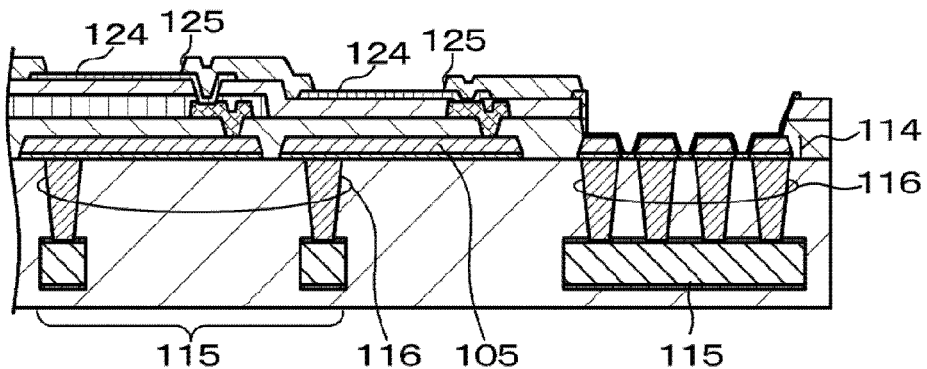
FIG. 32A to FIG. 32C are process views illustrating manufacturing steps (part 3) of the display panel having the wiring structure of the metal wiring according to Example 12.

Next, transparent electrodes 124 are formed using a material such as ITO and IZO (step in FIG. 31C), and then openings 125 are formed on the transparent electrodes 124 using a material such as SiO and SiN or an organic insulating film (step in FIG. 32A).

Figure 32B:
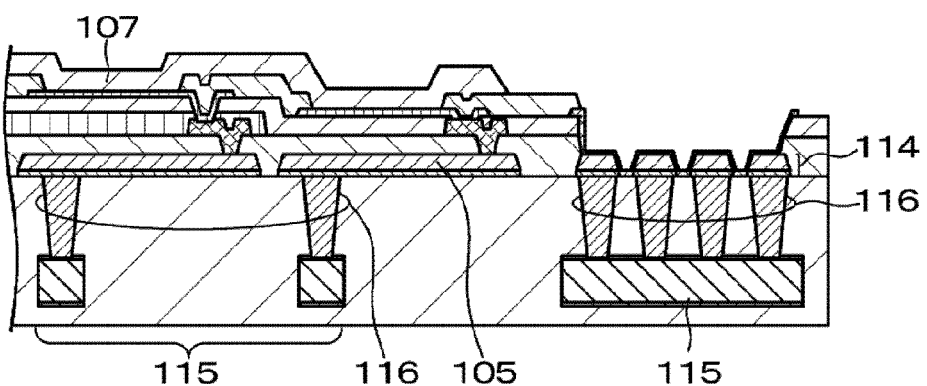
Figure 32C:
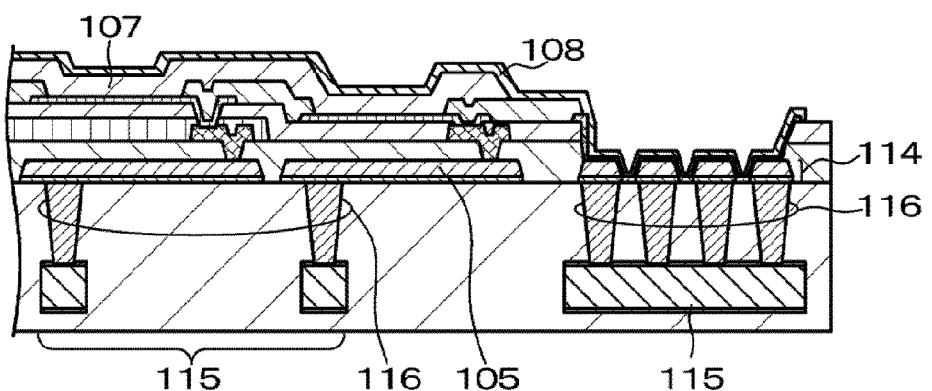

Next, an organic EL layer 107 is vapor-deposited in an effective pixel region (step in FIG. 32B). At the time of vapor deposition of the organic EL layer 107, mask vapor deposition or patterning is used so as not to form the organic EL layer 107 in a peripheral portion. Next, a cathode electrode 108 is formed using a material such as ITO, IZO, and MgAg (step in FIG. 32C).

Example 13

Example 13 is an example of layout patterns of the recesses 117 of the metal wiring 114. FIGS. 33 to 35 illustrate Pattern Examples 1 to 3 of the layout patterns according to Example 13.

In any cases of Pattern Examples 1 to 3, it is possible to apply Example 2 in which the first metal layer 114A and the second metal layer 114B are simultaneously processed, and Example 3 in which only the second metal layer 114B is processed to leave the first metal layer 114A. As described above, by applying Example 2, the contact area between the metal wiring 114 and the cathode electrode can be increased, and by applying Example 3, in a case where the first metal layer 114A includes, for example, titanium, the contact resistance between the metal wiring 114 and the cathode electrode can be reduced.

Pattern Example 1

Figure 33A:
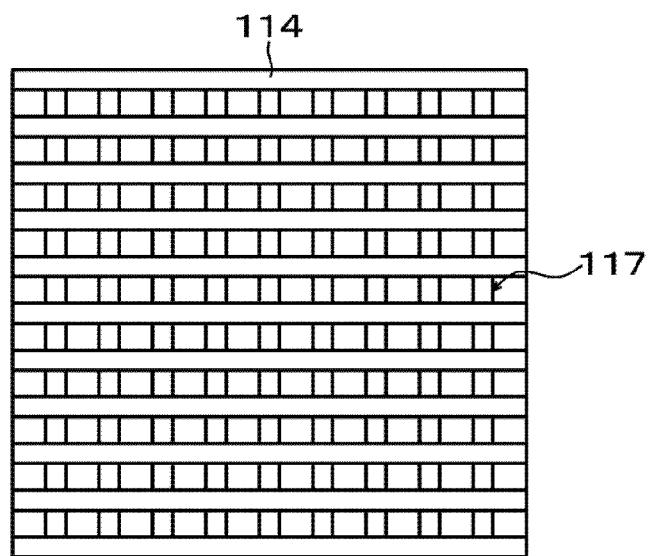
FIG. 33A and FIG. 33B are explanatory views of Pattern Example 1 of a layout pattern of recesses of a metal wiring.
Figure 33B:
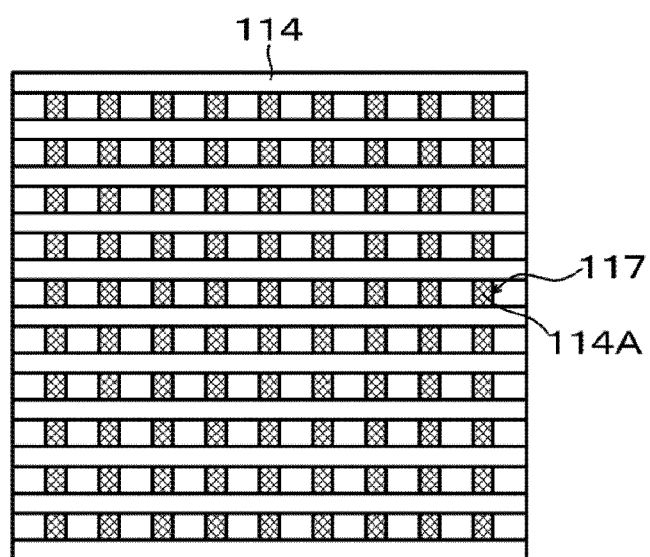

Pattern Example 1 is an example in which recesses 117 rectangular in plan view are laid out in a lattice shape. FIG. 33A illustrates a case where Example 2 in which the first metal layer 114A and the second metal layer 114B are simultaneously processed is applied to the layout in a lattice shape of Pattern Example 1, and FIG. 33B illustrates a case where Example 3 in which only the second metal layer 114B is processed to leave the first metal layer 114A is applied thereto.

Pattern Example 2

Figure 34A:
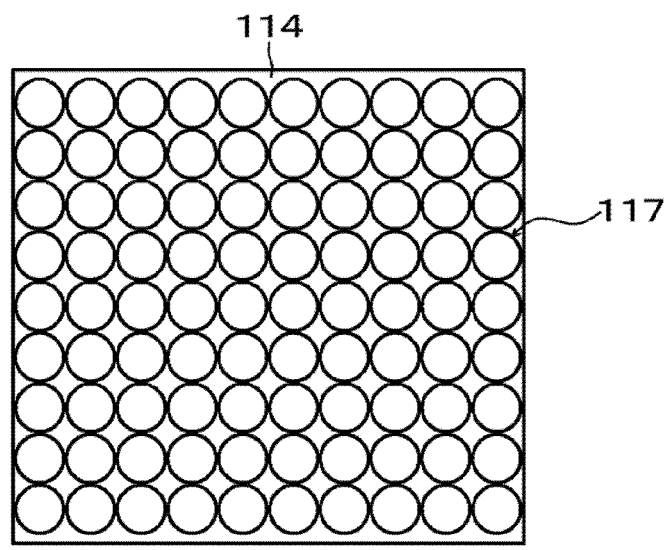
FIG. 34A and FIG. 34B are explanatory views of Pattern Example 2 of a layout pattern of recesses of a metal wiring.
Figure 34B:
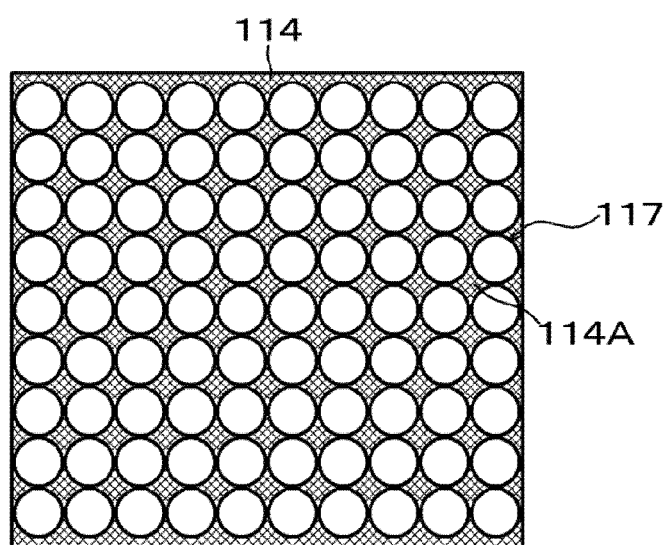

Pattern example 2 is an example in which recesses 117 in a circular shape in plan view are laid out in a rosary connection shape. FIG. 34A illustrates a case where Example 2 in which the first metal layer 114A and the second metal layer 114B are simultaneously processed is applied to the layout in a rosary connection shape of Pattern Example 2, and FIG. 34B illustrates a case where Example 3 in which only the second metal layer 114B is processed to leave the first metal layer 114A is applied thereto.

Pattern Example 3

Figure 35A:
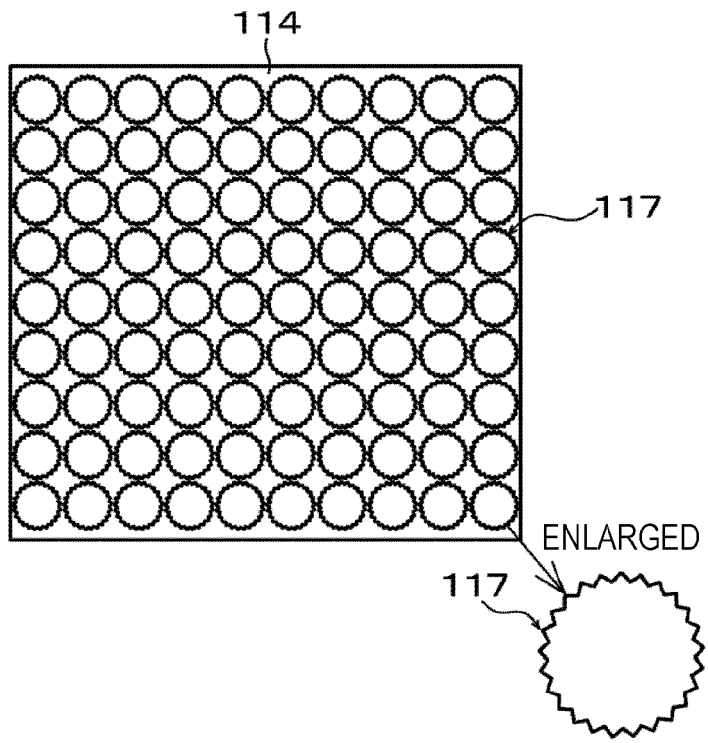
FIG. 35A and FIG. 35B are explanatory views of Pattern Example 3 of a layout pattern of recesses of a metal wiring.
Figure 35B:
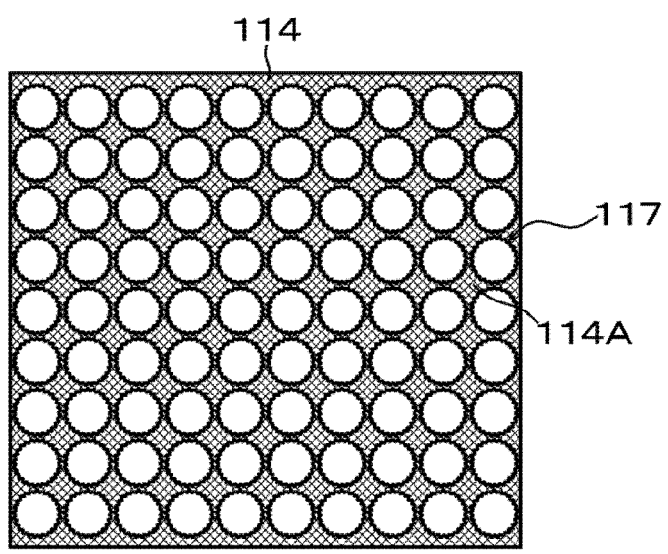

Pattern example 3 is an example in which recesses 117 whose side surface is notched like a saw tooth, that is, what is called a jagged connection shape are laid out in a jagged connection shape. FIG. 35A illustrates a case where Example 2 in which the first metal layer 114A and the second metal layer 114B are simultaneously processed is applied to the layout in a jagged connection shape of Pattern Example 3, and FIG. 35B illustrates a case where Example 3 in which only the second metal layer 114B is processed to leave the first metal layer 114A is applied thereto.

Figure 36A:
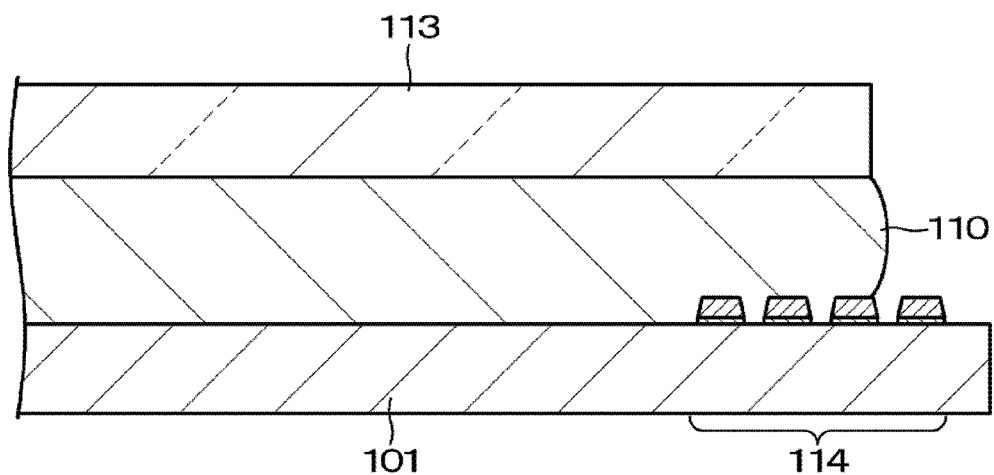
FIG. 36A and FIG. 36B are views for explaining operation and effect of an uneven structure of a metal wiring.
Figure 36B:
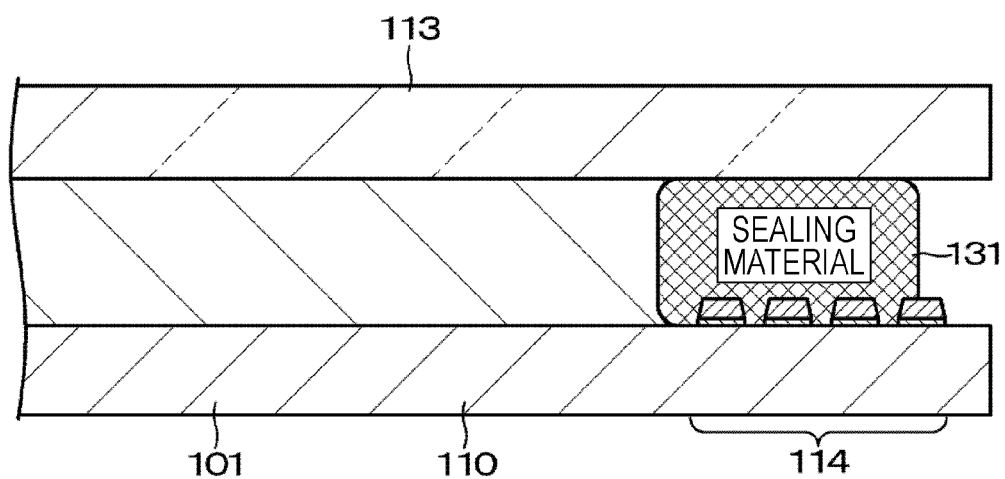

In the above, the operation and effect have been described that accompanies enlargement of the contact area with the cathode electrode 108 by forming the contact surface in the connection portion with the cathode electrode 108 as an uneven structure with respect to the metal wiring 114, but the operation and effect as follows can also be obtained by the uneven structure. Specifically, due to the uneven structure of the metal wiring 114 and the intermediate electrodes 121, the filler layer 110 intervening between the substrate 101 and the sealing substrate 113 can be prevented from protruding to the periphery to cause an abnormal outer shape as illustrated in FIG. 36A. Furthermore, it is possible to obtain an operation and effect that a sealing material 131 provided on an outer peripheral portion of the filler layer 110 does not protrude to the periphery or the inside as illustrated in FIG. 36B.

Modification Example

As described above, the technology of the present disclosure has been described on the basis of the preferred embodiment, but the technology of the present disclosure is not limited to the embodiment. The configuration and structure of the display device described in the embodiment described above are examples, and can be changed as appropriate. For example, in the embodiment described above, the organic EL element 21 and its drive circuit are assumed to be formed on a semiconductor substrate such as a silicon substrate but are not limited thereto, and can also be formed on an insulator substrate such as a glass substrate.

Furthermore, in the embodiment described above, although the circuit configuration illustrated in FIG. 2 is exemplified as a pixel circuit, it is not limited to the circuit configuration, and the number of transistors can be increased as necessary. For example, it is possible to connect a switching transistor between the drain electrode of the drive transistor 22 and a current discharge destination node (for example, the common power supply line 34), and control the organic EL element 21 to emit no light during a non-emission period of the pixel 20 by the switching transistor.

<Electronic Device of the Present Disclosure>

The display device of the present disclosure described above can be used as a display unit (display device) of an electronic device of any field that displays a video signal input to an electronic device or a video signal generated in the electronic device as an image or video. As the electronic device, a television set, a laptop personal computer, a digital still camera, a portable terminal device such as a mobile phone, a head-mounted display, and the like can be exemplified. However, it is not limited to these devices.

As described above, in the electronic devices in all fields, the following effects can be obtained by using the display device of the present disclosure as a display unit thereof. That is, with the display device of the present disclosure, the frame of the display panel can be narrowed. Therefore, by using the display device of the present disclosure, it is possible to contribute to downsizing of a main body of an electronic device.

The display device of the present disclosure includes one having a module shape with a sealed configuration. As an example, a display module in which an opposing portion of transparent glass or the like is attached to a pixel array unit corresponds to this. Note that the display module may be provided with a circuit portion, a flexible print circuit (FPC), or the like for inputting and outputting a signal and the like from the outside to the pixel array unit. Hereinafter, a digital still camera and a head-mounted display will be exemplified as specific examples of the electronic device using the display device of the present disclosure. However, the specific examples illustrated here are merely examples, and the present technology is not limited to these examples.

Specific Example 1

Figure 37A:
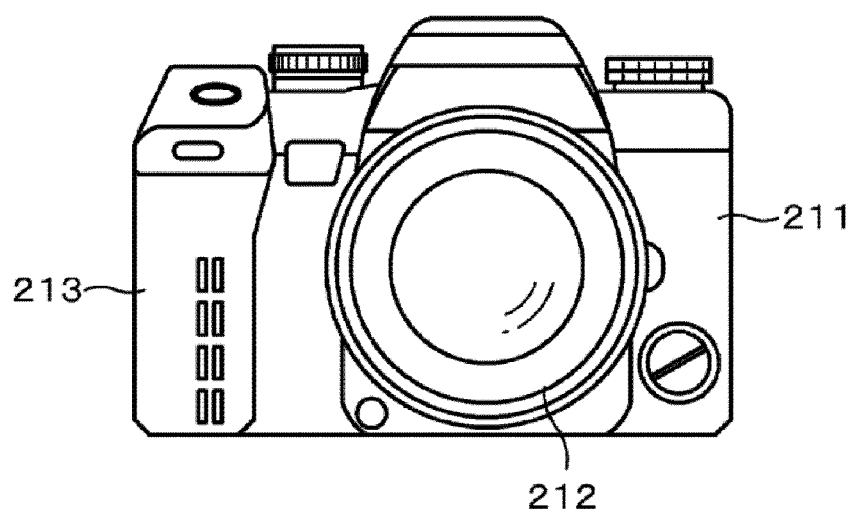
FIG. 37A is a front view of a lens interchangeable single-lens reflex digital still camera according to Specific Example 1 of an electronic device of the present disclosure.
Figure 37B:
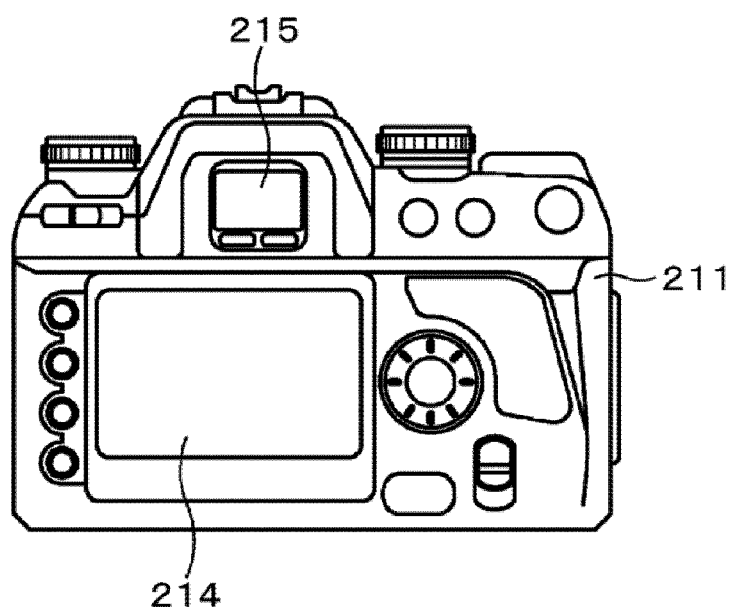
FIG. 37B is a rear view of the same.

FIG. 37 is an external view of a lens interchangeable single-lens reflex digital still camera according to Specific Example 1 of the electronic device of the present disclosure. FIG. 37A illustrates a front view thereof, and FIG. 37B illustrates a rear view thereof.

The digital still camera of the lens interchangeable single-lens reflex digital still camera according to the present Specific Example 1 has, for example, an interchangeable imaging lens unit (interchangeable lens) 212 on a front right side of a camera main body part (camera body) 211, and has a grip portion 213 for a photographer to hold on a front left side.

Then, a monitor 214 is provided at substantially the center of a rear surface of the camera main body part 211. An electronic viewfinder (eyepiece window) 215 is provided above the monitor 214. By looking through the electronic viewfinder 215, the photographer can visually confirm a light image of the subject guided from the imaging lens unit 212 and determine a picture composition.

In the lens interchangeable single-lens reflex digital still camera having the above configuration, the display device of the present disclosure can be used as the electronic viewfinder 215. That is, the lens interchangeable single-lens reflex digital still camera according to the present Specific Example 1 is manufactured by using the display device of the present disclosure as the electronic viewfinder 215.

Specific Example 2

Figure 38:
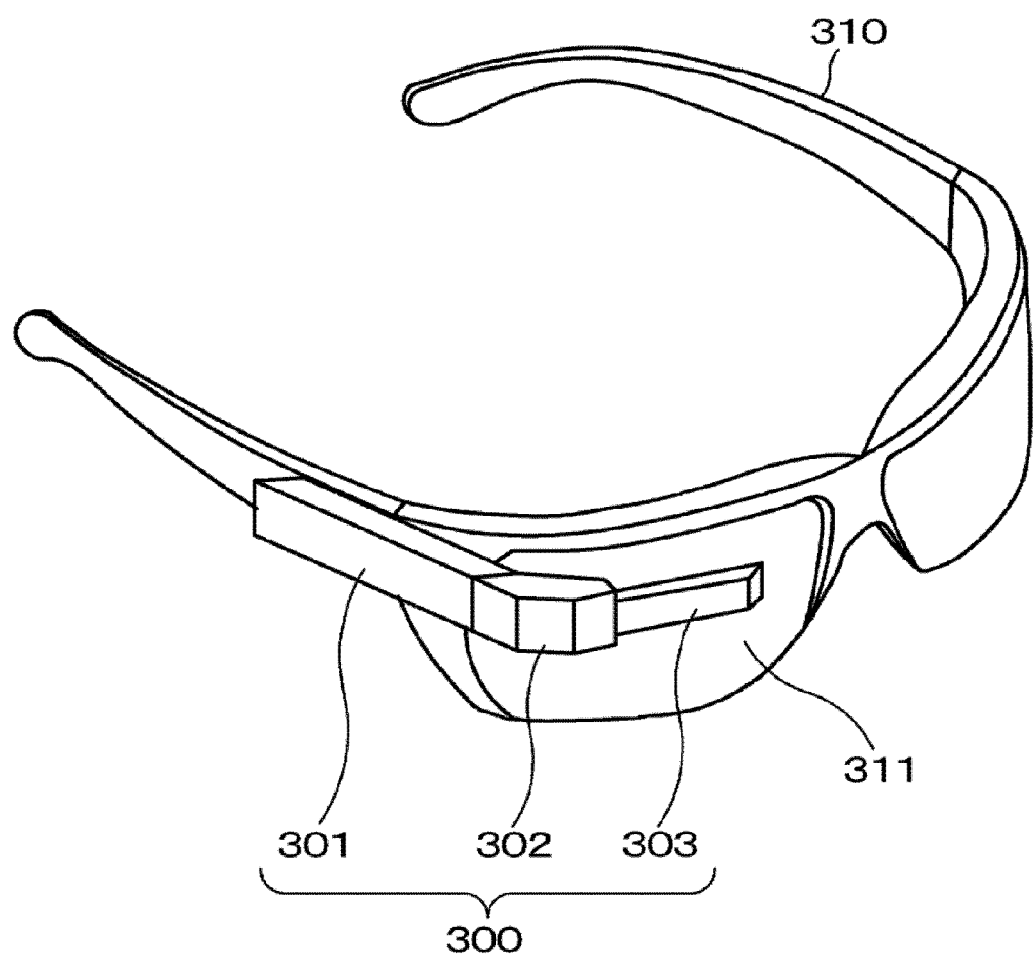
FIG. 38 is an external view illustrating an example of a head-mounted display according to Specific Example 2 of an electronic device of the present disclosure.

FIG. 38 is an external view illustrating an example of a head-mounted display according to Specific Example 2 of the electronic device of the present disclosure.

The head-mounted display 300 according to the present Specific Example 2 has a transmission type head-mounted display configuration having a main body part 301, an arm part 302, and a lens barrel 303. The main body part 301 is connected to the arm part 302 and glasses 310. Specifically, an end in a long side direction of the main body part 301 is attached to the arm part 302. Furthermore, one side of a side surface of the main body part 301 is connected to the glasses 310 with a connecting member (not illustrated) interposed therebetween. Note that the main body part 301 may be directly mounted on the head of a human body.

The main body part 301 includes a control board and a display unit for controlling operation of the head-mounted display 300. The arm part 302 supports the lens barrel 303 onto the main body part 301 by connecting the main body part 301 to the lens barrel 303. Specifically, the arm part 302 fixes the lens barrel 303 onto the main body part 301 by being coupled to an end of the main body part 301 and an end of the lens barrel 303. Furthermore, the arm part 302 includes a signal line for communicating data related to an image provided from the main body part 301 to the lens barrel 303.

The lens barrel 303 projects image light provided from the main body part 301 via the arm part 302 through the lens 311 of the glasses 310 toward the eye of the user wearing the head-mounted display 300.

In the head-mounted display 300 having the above configuration, the display device of the present disclosure can be used as a display unit included in the main body part 301. That is, the head-mounted display 300 according to the present Specific Example 2 is manufactured by using the display device of the present disclosure as the display unit.

<Configuration that Present Disclosure can Employ>

Note that the present disclosure can also employ the following configurations.

«A. Display Device»

[A-1] A display device having:

an organic electroluminescence (EL) layer formed on a circuit portion, which is formed on a substrate, with an insulating film interposed therebetween;

a cathode electrode formed on the organic EL layer in common to all pixels; and a metal wiring provided on an outer peripheral portion of an effective pixel region and electrically connecting the cathode electrode to a wiring of the circuit portion, in which the metal wiring has a recess or a projection on a contact surface in a connection portion with the cathode electrode.

[A-2] The display device according to above [A-1], in which a plurality of recesses or projections is provided on the contact surface with the cathode electrode.

[A-3] The display device according to any one of above [A-1] to [A-3], in which the recess or the projection has a tapered surface with a taper angle equal to or smaller than an angle that allows maintaining a film thickness of the cathode electrode equal to or larger than a certain value with respect to a base surface.

[A-4] The display device according to above [A-3], in which the recess or the projection has a tapered surface with a taper angle of 60 degrees or less with respect to the base surface.

[A-5] The display device according to any one of above [A-1] to [A-4], in which the metal wiring includes a first metal layer and a second metal layer stacked in this order, and the recess is formed so as to have a depth reaching a base by removing the first metal layer and the second metal layer.

[A-6] The display device according to any one of above [A-1] to [A-4], in which the metal wiring includes a first metal layer and a second metal layer stacked in this order, and the recess is formed by removing the second metal layer so that a bottom surface is in contact with the first metal layer.

[A-7] The display device according to above [A-6], in which the first metal layer has a smaller contact resistance than the second metal layer.

[A-8] The display device according to any one of above [A-1] to [A-4], in which the recess is formed so as to reach a lower wiring by processing an interlayer insulating layer of the base.

[A-9] The display device according to above [A-8], in which the metal wiring includes a first metal layer and a second metal layer stacked in this order, and a wiring structure of the recess is a three-layer structure having a third metal layer between the first metal layer and the second metal layer.

[A-10] The display device according to any one of above [A-1] to [A-4], in which the recess is formed so as to reach an inside of the lower wiring by processing an interlayer insulating layer of the base and the lower wiring.

[A-11] The display device according to above [A-10], in which the metal wiring includes a first metal layer and a second metal layer stacked in this order, and a wiring structure of the recess is a three-layer structure having a third metal layer between the first metal layer and the second metal layer.

[A-12] The display device according to any one of above [A-1] to [A-4], in which the recess is formed so as to reach an inside of the lower wiring by processing an interlayer insulating layer of the base and the lower wiring, the metal wiring includes a first metal layer and a second metal layer stacked in this order, and a wiring structure of the recess is a three-layer structure having a third metal layer between the first metal layer and the second metal layer, and a second recess is formed in the projection of the metal wiring by removing the second metal layer so that a bottom surface is in contact with the first metal layer.

[A-13] The display device according to any one of above [A-1] to [A-12], in which the recess is laid out in a lattice shape, a rosary connection shape, or a jagged connection shape.

[A-14] The display device according to any one of above [A-1] to [A-13], in which the substrate on which the circuit portion is formed includes a semiconductor substrate.

«B. Electronic Device»

[B-1] An electronic device having a display device having:

an organic electroluminescence (EL) layer formed on a circuit portion, which is formed on a substrate, with an insulating film interposed therebetween;

a cathode electrode formed on the organic EL layer in common to all pixels; and a metal wiring provided on an outer peripheral portion of an effective pixel region and electrically connecting the cathode electrode to a wiring of the circuit portion, in which the metal wiring has a recess or a projection on a contact surface in a connection portion with the cathode electrode.

[B-2] The electronic device according to above [B-1], in which a plurality of recesses or projections is provided on the contact surface with the cathode electrode.

[B-3] The electronic device according to any one of above [B-1] to [B-3], in which the recess or the projection has a tapered surface with a taper angle equal to or smaller than an angle that allows maintaining a film thickness of the cathode electrode equal to or larger than a certain value with respect to a base surface.

[B-4] The electronic device according to above [B-3], in which the recess or the projection has a tapered surface with a taper angle of 60 degrees or less with respect to the base surface.

[B-5] The electronic device according to any one of above [B-1] to [B-4], in which the metal wiring includes a first metal layer and a second metal layer stacked in this order, and the recess is formed so as to have a depth reaching a base by removing the first metal layer and the second metal layer.

[B-6] The electronic device according to any one of above [B-1] to [B-4], in which the metal wiring includes a first metal layer and a second metal layer stacked in this order, and the recess is formed by removing the second metal layer so that a bottom surface is in contact with the first metal layer.

[B-7] The electronic device according to above [B-6], in which the first metal layer has a smaller contact resistance than the second metal layer.

[B-8] The electronic device according to any one of above [B-1] to [B-4], in which
the recess is formed so as to reach a lower wiring by processing an interlayer insulating layer of the base.

[B-9] The electronic device according to above [B-8], in which
the metal wiring includes a first metal layer and a second metal layer stacked in this order, and a wiring structure of the recess is a three-layer structure having a third metal layer between the first metal layer and the second metal layer.

[B-10] The electronic device according to any one of above [B-1] to [B-4], in which
the recess is formed so as to reach an inside of the lower wiring by processing an interlayer insulating layer of the base and the lower wiring.

[B-11] The electronic device according to above [B-10], in which
the metal wiring includes a first metal layer and a second metal layer stacked in this order, and a wiring structure of the recess is a three-layer structure having a third metal layer between the first metal layer and the second metal layer.

[B-12] The electronic device according to any one of above [B-1] to [B-4], in which
the recess is formed so as to reach an inside of the lower wiring by processing an interlayer insulating layer of the base and the lower wiring,
the metal wiring includes a first metal layer and a second metal layer stacked in this order, and a wiring structure of the recess is a three-layer structure having a third metal layer between the first metal layer and the second metal layer, and a second recess is formed in the projection of the metal wiring by removing the second metal layer so that a bottom surface is in contact with the first metal layer.

[B-13] The electronic device according to any one of above [B-1] to [B-12], in which
the recess is laid out in a lattice shape, a rosary connection shape, or a jagged connection shape.

[B-14] The electronic device according to any one of above [B-1] to [B-13], in which
the substrate on which the circuit portion is formed includes a semiconductor substrate.

REFERENCE SIGNS LIST

10 Organic EL display device
20 Pixel (pixel circuit)
21 Organic EL element
22 Drive transistor
23 Sampling transistor
24 Light emission control transistor
25 Holding capacitor
26 Auxiliary capacitor
30 Pixel array unit
40 Writing scanning unit
50 Driving scanning unit
60 Signal output unit
70 Display panel
70A Effective pixel region
101 Substrate
102 Circuit layer
103 Inorganic insulating layer layer
104 Interlayer insulating layer
105 Anode electrode
106 Organic insulating layer
107 Organic EL layer
108 Cathode electrode
109 Organic protective layer
110 Filler layer (adhesive layer)
111 Black matrix layer
112 Color filter
113 Sealing substrate
114 Metal wiring
115 Lower wiring
116 Contact portion
117, 119 Recess

The invention claimed is:

1. A display device comprising:
an organic electroluminescence (EL) layer formed on a circuit portion, which is formed on a substrate, with an insulating film interposed therebetween;
a cathode electrode formed on the organic EL layer in common to all pixels; and
a metal wiring provided on an outer peripheral portion of an effective pixel region and electrically connecting the cathode electrode to a wiring of the circuit portion, wherein
the metal wiring has a recess or a projection on a contact surface in a connection portion with the cathode electrode, and
the recess or the projection has a tapered surface with a taper angle equal to or smaller than an angle that allows maintaining a film thickness of the cathode electrode equal to or larger than a certain value with respect to a base surface of a base.

2. The display device according to claim 1, wherein
a plurality of recesses or projections is provided on the contact surface with the cathode electrode.

3. The display device according to claim 1, wherein
the recess or the projection has a tapered surface with a taper angle of 60 degrees or less with respect to the base surface.

4. The display device according to claim 1, wherein
the recess is laid out in a lattice shape, a rosary connection shape, or a jagged connection shape.

5. The display device according to claim 1, wherein
the substrate on which the circuit portion is formed includes a semiconductor substrate.

6. An electronic device comprising a display device according to claim 1.

7. The electronic device according to, claim 6, wherein the recess or the projection has a tapered surface with a taper angle of 60 degrees or less with respect to the base surface.

8. A display device comprising:
an organic electroluminescence (EL) layer formed on a circuit portion, which is formed on a substrate, with an insulating film interposed therebetween;
a cathode electrode formed on the organic EL layer in common to all pixels; and
a metal wiring provided on an outer peripheral portion of an effective pixel region and electrically connecting the cathode electrode to a wiring of the circuit portion, wherein
the metal wiring has a recess on a contact surface in a connection portion with the cathode electrode,
the metal wiring includes a first metal layer and a second metal layer stacked in this order, and
the recess is formed so as to have a depth reaching a base by removing the first metal layer and the second metal layer.

9. An electronic device comprising a display device according to claim 8.

10. A display device comprising:
an organic electroluminescence (EL) layer formed on a circuit portion, which is formed on a substrate, with an insulating film interposed therebetween;
a cathode electrode formed on the organic EL layer in common to all pixels; and
a metal wiring provided on an outer peripheral portion of an effective pixel region and electrically connecting the cathode electrode to a wiring of the circuit portion, wherein
the metal wiring has a recess on a contact surface in a connection portion with the cathode electrode,
the metal wiring includes a first metal layer and a second metal layer stacked in this order, and
the recess is formed by removing the second metal layer so that a bottom surface is in contact with the first metal layer.

11. The display device according to claim 10, wherein the first metal layer has a smaller contact resistance than the second metal layer.

12. An electronic device comprising a display device according to claim 10.

13. A display device comprising:
an organic electroluminescence (EL) layer formed on a circuit portion, which is formed on a substrate, with an insulating film interposed therebetween;
a cathode electrode formed on the organic EL layer in common to all pixels; and
a metal wiring provided on an outer peripheral portion of an effective pixel region and electrically connecting the cathode electrode to a wiring of the circuit portion, wherein
the metal wiring has a recess on a contact surface in a connection portion with the cathode electrode, and
the recess is formed so as to reach a lower wiring by processing an interlayer insulating layer of a base.

14. The display device according to claim 13, wherein the metal wiring includes a first metal layer and a second metal layer stacked in this order, and a wiring structure of the recess is a three-layer structure having a third metal layer between the first metal layer and the second metal layer.

15. The display device according to claim 13, wherein the recess is formed so as to reach an inside of the lower wiring by processing the interlayer insulating layer of the base and the lower wiring.

16. The display device according to claim 15, wherein the metal wiring includes a first metal layer and a second metal layer stacked in this order, and a wiring structure of the recess is a three-layer structure having a third metal layer between the first metal layer and the second metal layer.

17. An electronic device comprising a display device according to claim 13.

18. A display device comprising:
an organic electroluminescence (EL) layer formed on a circuit portion, which is formed on a substrate, with an insulating film interposed therebetween;
a cathode electrode formed on the organic EL layer in common to all pixels; and
a metal wiring provided on an outer peripheral portion of an effective pixel region and electrically connecting the cathode electrode to a wiring of the circuit portion, wherein
the metal wiring has a recess and a projection on a contact surface in a connection portion with the cathode electrode,
the recess is formed so as to reach an inside of the lower wiring by processing an interlayer insulating layer of a base and the lower wiring,
the metal wiring includes a first metal layer and a second metal layer stacked in this order, and a wiring structure of the recess is a three-layer structure having a third metal layer between the first metal layer and the second metal layer, and a second recess is formed in the projection of the metal wiring by removing the second metal layer so that a bottom surface is in contact with the first metal layer.

19. An electronic device comprising a display device according to claim 18.

* * * * *